United States Patent
Chen et al.

(10) Patent No.: US 10,673,461 B2
(45) Date of Patent: Jun. 2, 2020

(54) HYBRID SCHEDULING AND LATCH-BASED PIPELINES FOR LOW-DENSITY PARITY-CHECK DECODING

(71) Applicant: Intel Corporation, Santa Clara, CA (US)

(72) Inventors: Chia-Hsiang Chen, Santa Clara, CA (US); Wei Tang, Hillsboro, OR (US); Farhana Sheikh, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/778,239

(22) PCT Filed: Dec. 24, 2015

(86) PCT No.: PCT/US2015/000424
§ 371 (c)(1),
(2) Date: May 23, 2018

(87) PCT Pub. No.: WO2017/111853
PCT Pub. Date: Jun. 29, 2017

(65) Prior Publication Data
US 2018/0351575 A1    Dec. 6, 2018

(51) Int. Cl.
*H03M 13/00* (2006.01)
*H03M 13/11* (2006.01)
*H04L 1/18* (2006.01)

(52) U.S. Cl.
CPC ...... *H03M 13/1122* (2013.01); *H03M 13/114* (2013.01); *H03M 13/116* (2013.01);
(Continued)

(58) Field of Classification Search
CPC ... H04L 1/18; H03M 13/1122; H03M 13/116; H03M 13/1137; H03M 13/114;
(Continued)

(56) References Cited

U.S. PATENT DOCUMENTS 8,151,161 B2 * 4/2012 Cho ............... H03M 13/1102
714/752
9,564,921 B1 * 2/2017 Graumann ......... H03M 13/1131
(Continued)

OTHER PUBLICATIONS

Park et al.: "Low-Power High-Throughput LDPC Decoder Using Non-Refresh Embedded DRAM", IEEE Journal of Solid-State Circuits, 2014, pp. 783-794, vol. 49, No. 3.
(Continued)

*Primary Examiner* — Guerrier Merant
(74) *Attorney, Agent, or Firm* — Viering, Jentschura & Partner MBB

(57) ABSTRACT

A pipeline decoding system for performing pipelined decoding of a codeword characterized by one or more parity checks may include a first pipeline stage circuit configured to process a first parity set composed of one or more first parity checks of the codeword and to process a second parity set composed of one or more second parity checks of the codeword, a second pipeline stage circuit configured to generate one or more codeword update messages for the second parity set based on a first estimate of the codeword, and a third pipeline stage circuit configured to update the first estimate of the codeword with one or more codeword update messages for the first parity set to obtain a second estimate of the codeword.

25 Claims, 14 Drawing Sheets

(52) U.S. Cl.
CPC .... *H03M 13/1134* (2013.01); *H03M 13/1137* (2013.01); *H04L 1/18* (2013.01)

(58) Field of Classification Search
CPC ......... H03M 13/1134; H03M 13/1102; H03M 13/6502; H03M 13/118; H03M 13/1131; H03M 13/6566; H03M 13/1125; H03M 13/1114; H03M 13/1117; H03M 13/112; H03M 13/1188; H03M 13/3715; H03M 13/3723; H03M 13/3753; H03M 13/47; H03M 13/616; H03M 13/6544; H03M 13/658; H03M 13/6583; H03M 13/1165
See application file for complete search history.

(56) References Cited

U.S. PATENT DOCUMENTS

| | | | |
|---|---|---|---|
| 2007/0220398 A1* | 9/2007 | Moon | H03M 13/1131 714/758 |
| 2008/0178065 A1 | 7/2008 | Khandekar et al. | |
| 2009/0013239 A1* | 1/2009 | Blanksby | H03M 13/1111 714/801 |
| 2009/0063926 A1* | 3/2009 | Cho | H03M 13/1102 714/752 |
| 2009/0113256 A1 | 4/2009 | Radosavljevic et al. | |
| 2009/0282316 A1* | 11/2009 | Lingam | H03M 13/11 714/763 |
| 2011/0010602 A1* | 1/2011 | Chung | H03M 13/1134 714/752 |
| 2011/0029756 A1* | 2/2011 | Biscondi | H03M 13/1114 712/22 |
| 2013/0117344 A1* | 5/2013 | Gross | G06F 17/10 708/490 |
| 2013/0275838 A1 | 10/2013 | Henige | |
| 2014/0157079 A1 | 6/2014 | Park et al. | |
| 2016/0336964 A1* | 11/2016 | Khalil | H03M 13/114 |

OTHER PUBLICATIONS

International Search Report based on application No. PCT/US2015/000424 (10 pages) dated Aug. 24, 2016 (Reference Purpose Only).
Sulek: "Pipeline processing in low-density parity-check codes hardware decoder", Bulletin of the Polish Academy of Sciences, Technical Sciences, 2011, 24 pages, vol. 59, No. 2.
Meinerzhagen et al. "Refresh-Free Dynamic Standard-Cell Based M, May 2015 emories: Application to a QC-LDPC Decoder", 2015 IEEE International Symposium on Circuits and Systems (ISCAS), May 2015, pp. 1426-1429.
Yen et al.: "A 5.79-Gb/s Energy-Efficient Multirate LDPC Codec Chip for IEEE 802.15.3c Applications", IEEE Journal of Solid-State Circuits, Sep. 2012, pp. 2246-2257, vol. 47, No. 9.
Ou et al.: "An 821MHz 7.9Gb/s 7.3pJ/b/iteration Charge-Recovery LDPC Decoder", IEEE International Solid-State Circuits Conference Digest of Technical Papers (ISSCC), 2014, 3 pages.
Seok et al.: "Pipeline Strategy for Improving Optimal Energy Efficiency in Ultra-Low Voltage Design", 48th ACM/EDAC/IEEE Design Automation Conference (DAC), 2011, pp. 990-995.
Weiner et al.: "A Scalable 1.5-to-6Gb/s 6.2-to-38.1mW LDPC Decoder for 60GHz Wireless Networks in 28nm UTBB FDSOI", IEEE International Solid-State Circuits Conference Digest of Technical Papers (ISSCC), 2014, 3 pages.
Zhong et al.: "Modified min-sum decoding algorithm for LDPC codes based on classified correction", Third International Conference on Communications and Networking in China, 2008, 5 pages.
Park et al.: "A Fully Parallel Nonbinary LDPC Decoder With Fine-Grained Dynamic Clock Gating", IEEE Journal of Solid-State Circuits, 2014, pp. 464-475.
Howard et al.: "Soft-Bit Decoding of Regular Low-Density Parity-Check Codes", IEEE Transactions on Circuits and Systems II: Express Briefs, 2005, 5 pages, vol. 52, Issue 10.

* cited by examiner

|  | bit0 | bit1 | bit2 | bit3 | bit4 | bit5 |  |
|---|---|---|---|---|---|---|---|
|  | 1 | 0 | 1 | 0 | 1 | 0 | check0 |
|  | 0 | 1 | 0 | 1 | 0 | 1 | check1 |
|  | 1 | 1 | 0 | 1 | 0 | 0 | check2 |
|  | 0 | 0 | 1 | 0 | 1 | 1 | check3 |

Parity check matrix

$bit0 + bit2 + bit4 = 0$ check0

$bit1 + bit3 + bit5 = 0$ check1

$bit0 + bit1 + bit3 = 0$ check2

$bit2 + bit4 + bit5 = 0$ check3

Parity check equations

Tanner graph

HYBRID SCHEDULING AND LATCH-BASED PIPELINES FOR LOW-DENSITY PARITY-CHECK DECODING

CROSS-REFERENCE TO RELATED APPLICATIONS

This application is a national stage entry according to 35 U.S.C. 371 of WIPO Patent Application No. PCT/US2015/000424, which was filed Dec. 24, 2015, and is incorporated herein by reference in its entirety.

TECHNICAL FIELD

Various embodiments relate generally to hybrid scheduling and latch-based pipelines for low-density parity-check decoding.

BACKGROUND

Low-Density Parity-Check (LDPC) codes have demonstrated near-capacity error correcting performance, and accordingly have been adopted in many communication standards including WiFi (Institute of Electrical and Electronics Engineers (IEEE) 802.1 in), WiMAX (IEEE 802.16e), digital satellite broadcast (Digital Video Broadcasting-Satellite-Second Generation (DVB-S2)), and 10-gigabit Ethernet (IEEE 802.03an). Despite having excellent data rate and error recovery performance, LDPC decoders may have significant power requirements, which may only be exasperated in next generation wireless communication systems that have target data rates of e.g. 10 times the current standard data rates.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a parity check matrix;
FIG. 2 shows a set of parity check equations.

DESCRIPTION

Figure 3:
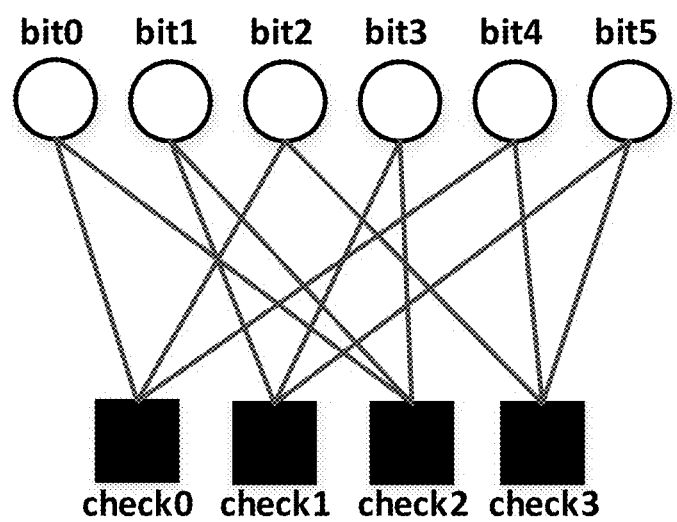
FIG. 3 shows a Tanner graph.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The words "plural" and "multiple" in the description and the claims expressly refer to a quantity greater than one. Accordingly, any phrases explicitly invoking the aforementioned words (e.g. "a plurality of [objects]", "multiple [objects]") referring to a quantity of objects expressly refers more than one of the said objects. The terms "group (of)", "set [of]", "collection (of)", "series (of)", "sequence (of)", "grouping (of)", etc., and the like in the description and in the claims, if any, refer to a quantity equal to or greater than one, i.e. one or more.

It is appreciated that any vector and/or matrix notation utilized herein is exemplary in nature and is employed solely for purposes of explanation. Accordingly, it is understood that the approaches detailed in this disclosure are not limited to being implemented solely using vectors and/or matrices, and that the associated processes and computations may be equivalently performed with respect to sets, sequences, groups, etc., of data, observations, information, signals, etc. Furthermore, it is appreciated that references to a "vector" may refer to a vector of any size or orientation, e.g. including a 1×1 vector (e.g. a scalar), a 1×M vector (e.g. a row vector), and an M×1 vector (e.g. a column vector). Similarly, it is appreciated that references to a "matrix" may refer to matrix of any size or orientation, e.g. including a 1×1 matrix (e.g. a scalar), a 1×M matrix (e.g. a row vector), and an M×1 matrix (e.g. a column vector).

As used herein, a "circuit" may be understood as any kind of logic implementing entity (analog or digital), which may be special purpose circuitry or a processor executing software stored in a memory, firmware, hardware, or any combination thereof. Furthermore, a "circuit" may be a hard-wired logic circuit or a programmable logic circuit such as a programmable processor, for example a microprocessor (for example a Complex Instruction Set Computer (CISC) processor or a Reduced Instruction Set Computer (RISC) processor). A "circuit" may also be a processor executing software, for example any kind of computer program, for example a computer program using a virtual machine code such as for example Java. Any other kind of implementation of the respective functions which will be described in more detail below may also be understood as a "circuit". It is understood that any two (or more) of the described circuits may be combined into a single circuit with substantially equivalent functionality, and conversely that any single described circuit may be distributed into two (or more) separate circuits with substantially equivalent functionality. Accordingly it is understood that references to a "circuit" may refer to two or more circuits that collectively form a single circuit.

A "processing circuit" (or equivalently "processing circuitry") as used herein is understood as referring to any circuit that performs an operation on a signal or signals, such as e.g. any circuit that performs processing on an electrical signal or an optical signal. A processing circuit may thus refer to any analog or digital circuitry that alters a characteristic or property of an electrical or optical signal, which may include analog and/or digital data. A processing circuit may thus refer to an analog circuit (explicitly referred to as "analog processing circuit(ry)"), digital circuit (explicitly referred to as "digital processing circuit(ry)"), logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Accordingly, a processing circuit may refer to a circuit that performs processing on an electrical or optical signal as hardware or as software, such as software executed on hardware (e.g. a processor or microprocessor). As utilized herein, "digital processing circuit(ry)" may refer to a circuit implemented using digital logic that performs processing on a signal, e.g. an electrical or optical signal, which may include logic circuit(s), processor(s), scalar processor(s), vector processor(s), microprocessor(s), controller(s), microcontroller(s), Central Processing Unit(s) (CPU), Graphics Processing Unit(s) (GPU), Digital Signal Processor(s) (DSP), Field Programmable Gate Array(s) (FPGA), integrated circuit(s), Application Specific Integrated Circuit(s) (ASIC), or any combination thereof. Furthermore, it is understood that a single a processing circuit may be equivalently split into two separate processing circuits, and conversely that two separate processing circuits may be combined into a single equivalent processing circuit.

As used herein, "memory" may be understood as an electrical component in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, etc., or any combination thereof. Furthermore, it is appreciated that registers, shift registers, processor registers, data buffers, etc., are also embraced herein by the term memory. It is appreciated that a single component referred to as "memory" or "a memory" may be composed of more than one different type of memory, and thus may refer to a collective component comprising one or more types of memory. It is readily understood that any single memory component may be separated into multiple collectively equivalent memory components, and vice versa. Furthermore, it is appreciated that while memory may be depicted, such as in the drawings, as separate from one or more other components, it is understood that memory may be integrated within another component, such as on a common integrated chip.

The term "base station" used in reference to an access point of a mobile communication network may be understood as a macro base station, micro base station, Node B, evolved NodeBs (eNB), Home eNodeB, Remote Radio Head (RRH), relay point, etc.

As used herein, a "cell" in the context of telecommunications may be understood as a sector served by a base station. Accordingly, a cell may be a set of geographically co-located antennas that correspond to a particular sectorization of a base station. A base station may thus serve one or more cells (or sectors), where each cell is characterized by a distinct communication channel. Furthermore, the term "cell" may be utilized to refer to any of a macrocell, microcell, femtocell, picocell, etc.

It is appreciated that the ensuing description may detail exemplary scenarios involving mobile device operating according to certain 3GPP (Third Generation Partnership Project) specifications, notably Long Term Evolution (LTE) and Long Term Evolution-Advanced (LTE-A). It is understood that such exemplary scenarios are demonstrative in nature, and accordingly may be similarly applied to other mobile communication technologies and standards, such as WLAN (wireless local area network), WiFi, UMTS (Universal Mobile Telecommunications System), GSM (Global System for Mobile Communications), Bluetooth, CDMA (Code Division Multiple Access), Wideband CDMA (W-CDMA), etc. The examples provided herein are thus understood as being applicable to various other mobile communication technologies, both existing and not yet formulated, particularly in cases where such mobile communication technologies share similar features as disclosed regarding the following examples.

For purposes of this disclosure, radio communication technologies may be classified as one of a Short Range radio communication technology, Metropolitan Area System radio communication technology, or Cellular Wide Area radio communication technology. Short Range radio communication technologies include Bluetooth, WLAN (e.g. according to any IEEE 802.11 standard), and other similar radio communication technologies. Metropolitan Area System radio communication technologies include Worldwide Interoperability for Microwave Access (WiMax) (e.g. according to an IEEE 802.16 radio communication standard, e.g. WiMax fixed or WiMax mobile) and other similar radio communication technologies. Cellular Wide Area radio communication technologies include GSM, UMTS, LTE, LTE-Advanced (LTE-A), CDMA, WCDMA, LTE-A, General Packet Radio Service (GPRS), Enhanced Data Rates for GSM Evolution (EDGE), High Speed Packet Access (HSPA), HSPA Plus (HSPA+), and other similar radio communication technologies.

The term "network" as utilized herein, e.g. in reference to a communication network such as a mobile communication network, is intended to encompass both an access section of a network (e.g. a radio access network (RAN) section) and a core section of a network (e.g. a core network section).

As utilized herein, the term "radio idle mode" or "radio idle state" used in reference to a mobile terminal refers to a radio control state in which the mobile terminal is not allocated at least one dedicated communication channel of a mobile communication network. The term "radio connected mode" or "radio connected state" used in reference to a mobile terminal refers to a radio control state in which the mobile terminal is allocated at least one dedicated uplink communication channel of a mobile communication network.

Unless explicitly specified, the term "transmit" encompasses both direct and indirect transmission. Similarly, the term "receive" encompasses both direct and indirect reception unless explicitly specified.

Low-Density Parity-Check (LDPC) codes are linear error-correcting block codes that have been adopted in a variety of communication standards. LDPC encoders may receive an input data sequence, partition the input data sequence into one or more input blocks, generate one or more parity bits for each input block, and append the one or more parity bits to each input block to generate an LDPC codeword for each input block. LDPC decoders may receive the resulting sequence of LDPC codewords following transmission and evaluate each received LDPC codeword to correct any transmission errors and optimally recover the original input data sequence. LDPC encoders and decoders may be respectively defined by a parity generation matrix G and parity check matrix H, and may differ from conventional linear block codes by having "sparse" parity generation and check matrices G and H. The sparse nature of G and H may limit the statistical dependency between each parity check, and consequently may allow LDPC codes to enjoy improved performance over conventional linear block codes.

An LDPC decoder may receive the resulting LDPC codewords and use the appended parity bits in order to both identify and correct transmission errors using an M×N parity check matrix H, where N is the LDPC codeword length and M is the number of parity checks. FIG. 1 shows an exemplary parity check matrix 100 with M=4 and N=6, which an LDPC decoder may apply to 6-bit codewords to calculate 4 parity checks check0-check3 each corresponding to a row of parity check matrix 100. An LDPC decoder may calculate each of parity checks check0-check3 according to the non-zero elements each row of parity check matrix 100. An LDPC decoder may evaluate each parity check check0-check3 by performing an XOR calculation between the bits of a received codeword that have bit indices corresponding to a non-zero element of H.

FIG. 2 shows exemplary parity check equations 200, which define the parity check equations used for each of check0-check3. An LDPC decoder may identify a valid codeword if each of parity check equations 200 is satisfied, where each parity check equation is defined by the non-zero elements of each row of parity check matrix 100. For example, the first row (check0) is non-zero at indices bit0, bit2, and bit4. Accordingly, check0 may be satisfied if bit0+bit2+bit4=0 (mod 2). Such may similarly be shown for each of check1-check3.

An LDPC decoder may also be represented as a Tanner graph, such as Tanner graph 300 as depicted in FIG. 3. As shown by Tanner graph 300 in FIG. 3, Tanner graphs may be bipartite graphs composed of Variable Nodes (VNs) and Check Nodes (CNs), where each VN is connected to one or more CNs via bidirectional edges. The bidirectional edges for each VN and each CN is similarly defined by the non-zero elements of the parity check matrix, where e.g. $CN_0$ (check0) is bidirectionally connected to $VN_0$ (bit0), $VN_2$ (bit2), and $VN_4$ (bit4). Each CN may thus receive input from each necessary VN and subsequently evaluate the corresponding parity check equation to determine if each parity check is satisfied.

LDPC codes may differ from other linear block codes in that the parity check matrix for LDPC codes has relatively few non-zero elements, i.e. is a sparse matrix, which may limit the interconnections between VNs and CNs (as depicted on Tanner graph) and consequently limit the statistical dependency between the parity checks of each CN. For example, each VN $VN_i$, i=1, 2, ..., N in Tanner graph 300 may have a variable degree $d_{v,i}$=2 and each CN $CN_j$, j=1, 2, ..., M may have a check degree $d_{c,j}$=3. Tanner graph 300 may thus represent a "regular" LDPC code (as opposed to an "irregular" LDPC code), where regular LDPC codes have uniform variable degrees and check degrees for each respective VN and CN. Such is equivalent to parity check matrix 100 containing the same number of non-zero elements in each row (constant row weight) and containing the same number of non-zero elements in each column (constant column weight).

It is noted that the exemplary parity check matrix, parity check equations, and Tanner graph of FIGS. 1-3 have been simplified for purposes of explanation, and actual LDPC realizations may be composed of e.g. M=126, 168, 252, or 336 CNs and N=672 VNs as in the case of LDPC codes utilized in the IEEE 802.1 lad standard. Various other realizations, e.g. with different M and N values, are also within the scope of this disclosure.

Figure 4:
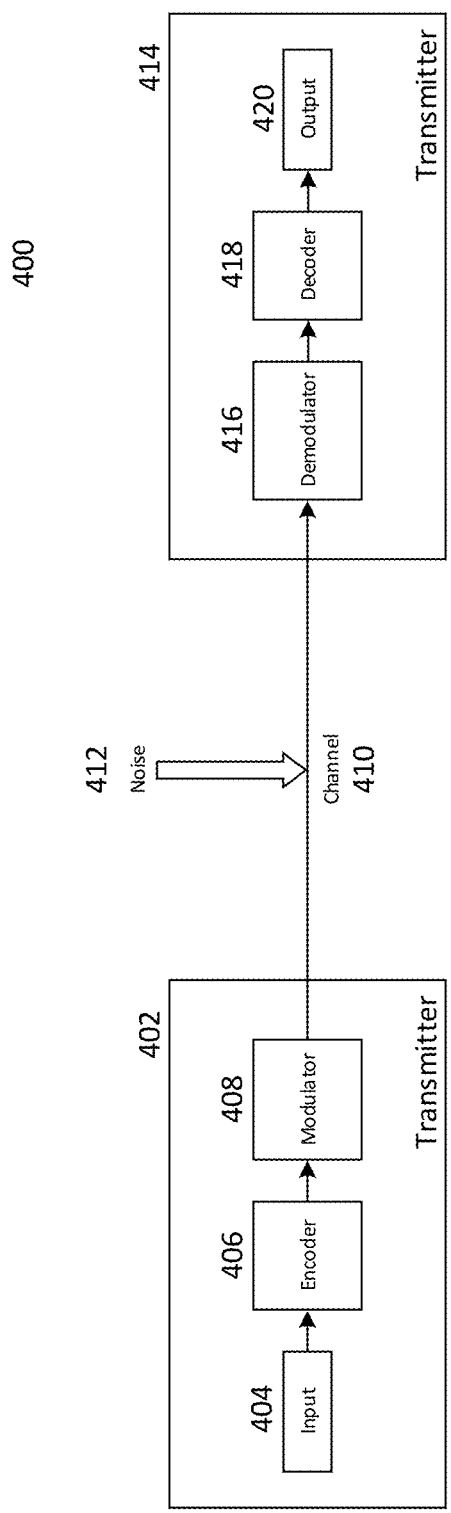
FIG. 4 shows a transmission and reception system.

Transmitter-receiver pairs may utilize LDPC codes to exchange data over a particular channel. FIG. 4 shows system 400, which as shown in FIG. 4 may include transmitter 402, channel 410, and receiver 414. Transmitter 402 and receiver 414 may be realized as any of a number of different electrical devices, which may include in communication devices (wired or wireless, including e.g. wireless communication devices) or memory devices (e.g. flash memory, disk encoding/decoding).

Transmitter 402 may encode and transmit input sequence 404 over channel 410, which receiver 414 may receive and decode to obtain output sequence 420. Transmitter 402 may obtain input sequence 404, which transmitter 402 may store in a memory component such as e.g. a buffer. Encoder circuit 406 may receive input sequence 404, partition input sequence 404 into blocks (e.g. of a predefined block length according to the LDPC code), generate one or more parity bits for each block (e.g. according to predefined LDPC generation parameters, such as a generator matrix), and append the respective parity bits to each block to generate an LDPC codeword for each block. Encoder circuit 406 may thus produce an encoded sequence composed of the sequence of LDPC codewords corresponding to input sequence 404, and provide the encoded sequence to modulator circuit 408. Modulator circuit 408 may then modulate the encoded sequence, such as according to a predefined channel modulation configuration, to generate a modulated sequence for transmission over channel 410. Transmitter 402 may then transmit the modulated sequence over channel 410, which may be either a wired or a wireless channel.

Receiver 414 may then receive the modulated sequence, which may include noise 412 introduced via transmission over channel 410. Accordingly, the modulated sequence may contain transmission error. Demodulator circuit 416 may then demodulate the modulated sequence and provide the resulting demodulated sequence to decoder circuit 418. Decoder circuit 418 may then apply LDPC decoding to decode the demodulated sequence and subsequently produce decoded output sequence 420, which may correspond to input sequence 404.

Decoder circuit 418 may thus receive the demodulated sequence from demodulator circuit 416 and process the demodulated sequence as a set of received codewords (each corresponding to an LDPC codeword of the encoded sequence generated by encoder circuit 406), which may contain error resulting from the introduction of noise 412 by channel 410. Decoder circuit 418 may be able to identify and correct such errors by evaluating the bits of each received codeword according to the LDPC parity check equations defined by H. In order to effectively decode each received codeword, decoder circuit 418 may attempt to identify a valid codeword (i.e. an LDPC codeword that satisfies each parity check) that closely matches the received codeword, such as a valid codeword $\hat{x}$ that satisfies $\hat{x} \cdot H^T = 0$ where $H^T$ is the transpose of H. In an optimal decoding scenario (i.e. for maximum likelihood decoding), decoder circuit 418 may identify a valid estimated codeword $\hat{x}$ for each received codeword that provides the closest match to each received codeword, e.g. a valid estimated codeword $\hat{x}$ having the minimum distance (e.g. Hamming distance) to the received codeword relative to the other possible valid codewords. However, such optimal decoding may not be realizable in practical applications due to the associated computational complexity (NP-complete) of maximum likelihood LDPC decoding.

Decoder circuit 418 may thus instead employ belief propagation (BP) decoding in order to decode each received codeword. In BP decoding, each VN may correspond to a single bit of the received codeword, and may exchange messages with each connected CN in order to update an estimated soft value of the corresponding codeword bit stored at each VN. Each CN may receive an estimated soft value from each connected VN and evaluate the parity check equation based on the received soft values. Each CN may then provide each VN with an adjustment value based on the parity check evaluation, which each VN may utilize to update the estimated soft value at each VN. BP decoding may be implemented as an iterative process in which each adjustment value applied by each VN per iteration causes the estimated codeword composed of the soft values of each CN to converge towards a valid codeword $\hat{x}$ that satisfies $\hat{x} \cdot H^T = 0$. Accordingly, BP decoding may involve passing Variable-to-Check (V2C) messages and Check-to-Variable (C2V) messages between each connected (according to the bidirectional edges of the Tanner graph representation) VN and CN. Each VN may thus update the stored soft value (corresponding to a codeword bit) based on each V2C, and may continue to iteratively update the stored soft value based on the C2Vs received during each iteration until either the codeword collectively represented by the soft values of each VN converges to a valid codeword (i.e. where the parity checks for each CN are satisfied) or until a termination condition is reached (e.g. a maximum number of iterations).

Accordingly, decoder circuit 418 may need to perform VN processing in order to generate V2C messages and update VN soft values, CN processing in order to generate C2V messages, and routing in order to route each V2C and C2V. Decoder circuit 418 may be realized as either software or hardware. In a hardware implementation, decoder circuit 418 may either be realized as a direct mapping of the parity check matrix H in which each CN and VN is realized as a dedicated hardware component ("fully parallel" as will be detailed, e.g. having N VN components and M CN components) or may re-use a reduced number of hardware components to realize subsets of the CNs and VNs at a time ("partially parallel" as will be detailed, e.g. N'<N VN components and/or M'<M CN components). Alternatively, decoder circuit 418 may be realized as software, and accordingly may be a processor configured to execute the CN and VN processing as program code defined as instructions for arithmetic, logical, control, and input/output (I/O) operations executed on a processor. Skilled persons will appreciate the algorithmic description included herein and recognize the possibility of such hardware and software realizations. While the following description may focus on hardware and hardware components, skilled persons will recognize the possibility to implement the functionality of such hardware components as software.

Figure 5:
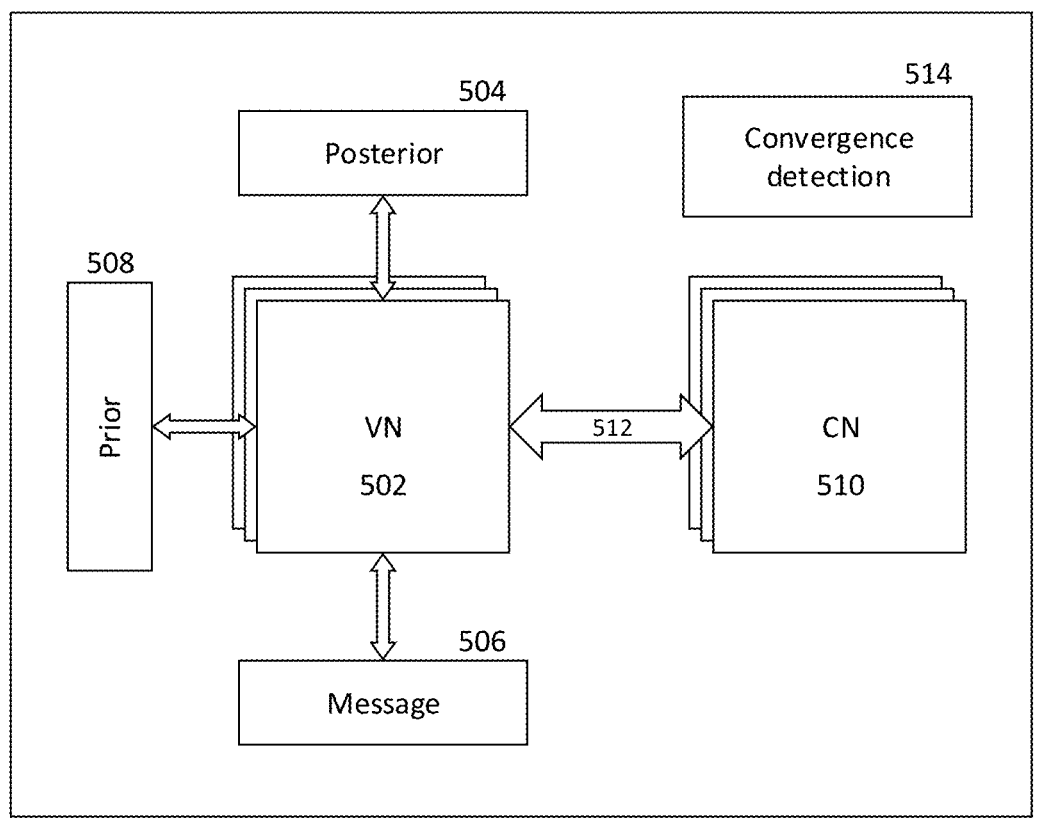
FIG. 5 shows a decoder circuit.

FIG. 5 shows an exemplary hardware realization of decoder circuit 418 configured to implement BP decoding. As shown in FIG. 5, decoder circuit 418 may include one or more VN circuits 502, posterior memory 504, message memory 506, prior memory 508, routing network 512, one or more CN circuits 510, and convergence detection circuit 514. Each VN circuit 502 may be configured to store a prior probability and posterior probability in prior memory 508 and posterior memory 504, respectively, (which may be composed of separate prior and posterior memories for each VN circuit 502, e.g. as separate registers), where the prior probability for each VN circuit 502 is an initial soft-bit value of a corresponding bit of the LDPC codeword and the posterior probability for each VN circuit 502 is an updated soft-bit value of the corresponding bit of the LDPC codeword. Each VN circuit 502 may be configured to update the prior probability to obtain a posterior probability and continue to update the posterior probability based on C2Vs received from CN circuits 510, and may store each C2V in message memory 506 (which may be composed of separate message memories for each VN circuit 502, e.g. as separate registers). Each VN circuit 502 may be configured to calculate a V2C to send to CN circuits 510 based on the posterior probability (soft bit value for a VN) stored in posterior memory 504 and the C2Vs stored in message memory 506, and accordingly may be composed of logic circuitry (as will be later detailed) to generate each requisite V2C. As will be detailed, decoder circuit 418 may be configured to operate according to a pipeline scheduling scheme.

Each VN circuit 502 may transmit each outgoing V2C to CN circuits 510 via routing network 512, which may be a programmable or hard-wired network that connects each VN circuit 502 to specific destination CN circuits 510. Each CN circuit 510 may receive incoming V2Cs and generate responses to each V2C in the form of C2Vs, which may be considered "adjustment" values tailored for each destination VN circuit 502. More specifically, each CN circuit 510 may evaluate the corresponding parity check equation and determine an adjustment value as a C2V for each connected VN circuit 502 based on a marginal probability for each connected VN derived from the parity check equation. Each CN circuit 510 may transmit the C2Vs to each destination VN circuit 502 via routing network 512. Each VN circuit 502 may receive the C2Vs and apply the C2V to adjust the posterior probability stored in posterior memory 504. The posterior probabilities for each VN circuit 502 at any given iteration may thus represent the current estimate of the original codeword. The V2C and C2V message passing may continue until the current estimated codeword converges to a valid LDPC codeword (i.e. the parity check equations for each CN circuit 510 are satisfied) or until a termination criteria is reached. The V2C message generation and routing, C2V message generation and routing, and posterior probability update may compose a single iteration of the BP decoding procedure implemented by decoder circuit 418, where the posterior probability for each VN is updated once during each iteration. Convergence detection circuit 514 may utilize the current posterior values for each VN stored in posterior memory 504 to determine whether the estimated codeword is a valid codeword and, if so, terminate the decoding procedure. Convergence detection circuit 514 may additionally be configured to monitor for termination criteria, such as whether a maximum number of decoding iterations have been executed, and potentially declare decode failures if the estimated codeword has not converged to a valid codeword in a maximum number of decoding iterations.

Figure 6:
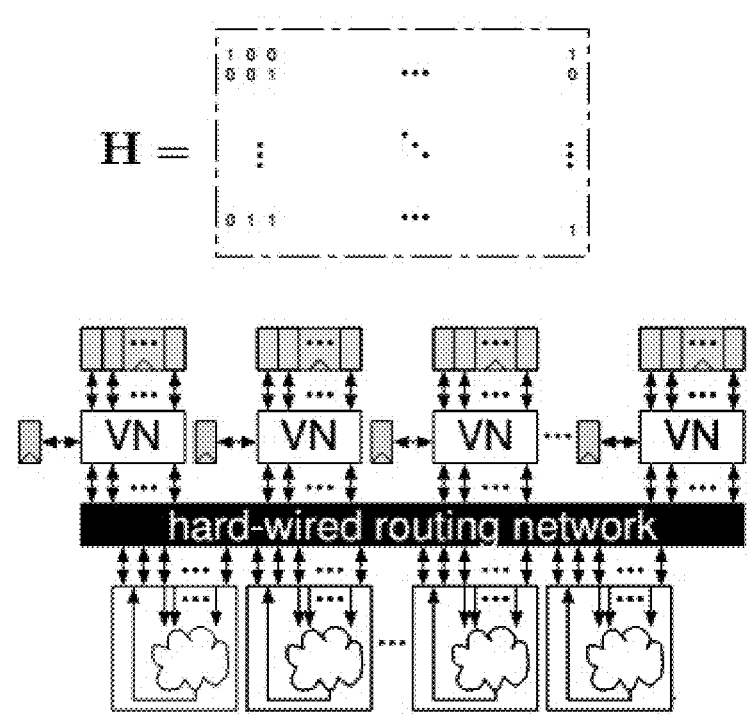
FIG. 6 shows a fully parallel realization of a decoder circuit.

The number of VN circuits 502, number of CN circuits 510 and configuration of routing network 512 may vary depending on the desired throughput of decoder circuit 418. For example, decoder circuit 418 may be configured according to a "fully parallel" architecture as shown in FIG. 6 if maximum throughput is desired. In such a fully parallel architecture, one or more VN circuits 502, posterior memory 504, message memory 506, routing network 512, and one or more CN circuits 510 may provide a direct mapping of the parity check matrix. Accordingly, one or more VN circuits 502 may be composed of N VN circuits, one or more CN circuits 510 may be composed of M CN circuits, and routing network 512 may be a hard-wired routing network connecting each VN circuit to the specific CN circuits required by the parity check of each CN (e.g. as represented by the bidirectional edges between VNs and CNs in a Tanner graph representation). Each VN circuit 502 may thus uniquely correspond to a distinct i-th bit $y_i$ of the received codeword $y = (y_1, y_2 \ldots y_N)$ and $\hat{x}_i$ of an estimated codeword $\hat{x} = (x_1, x_2 \ldots, x_N)$ produced by decoder circuit 418, and accordingly may be configured to perform the processing for a given VN $VN_i$, $i \in \{1, 2, \ldots, N\}$. Similarly, each CN circuit 510 may be configured to perform the processing for a given $CN_j$, $j \in \{1, 2, \ldots, M\}$.

Prior memory 508 and posterior memory 504 may be respectively capable of storing N prior and posterior probabilities (one per VN/VN circuit 502), and accordingly may be realized as N separate prior and posterior memories (such as e.g. a register) each connected to a respective VN circuit 502. Similarly, message memory 506 may be capable of storing the C2V messages ($d_{v,i}$ for a given $VN_i$) for each of the N VN/VN circuits 502, and accordingly may be realized as N separate posterior memories each connected to a respective VN circuit 502 (such as e.g. a register) and capable of storing $d_{v,i}$ C2V messages for a given $VN_i$. In such a realization, decoder circuit 418 may be able to perform each iteration in a single clock cycle, as each VN circuit 502 may be able to concurrently update the corresponding posterior probability (thus allowing for each of the N bits of the estimated codeword to be concurrently updated in parallel).

Figure 7:
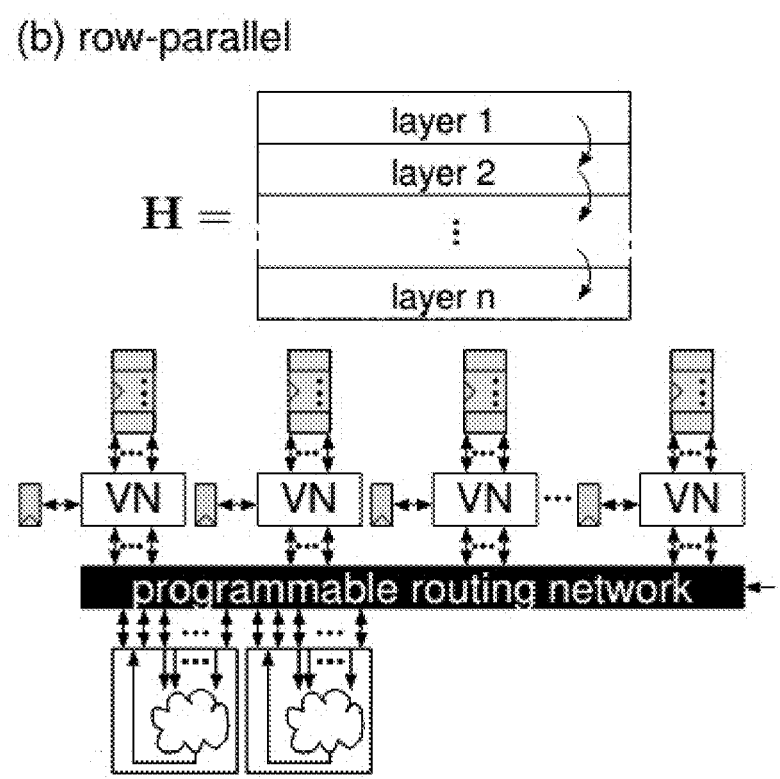
FIG. 7 shows a row-parallel realization of a decoder circuit.

A fully parallel realization of decoder circuit 418 may provide high throughput at the expense of high routing complexity of routing network 512 and low area utilization. Decoder circuit 418 may be realized according to a "row parallel" architecture as depicted in FIG. 7. In such a realization, decoder circuit 418 may be configured to process one or more rows of the parity check matrix at a time, and accordingly may not need separate CN circuits 510 for each of the M VNs. Accordingly, decoder circuit 418 may be composed of N VN circuits 502 and less than M CN circuits 510, e.g. M'<M CN circuits 510, as decoder circuit 418 may only perform CN processing for M' CNs at a time for M' rows of the parity check matrix. Decoder circuit 418 may thus have a separate VN circuit 502 for each of the N VNs (which may each be connected to a respective prior memory 508, posterior memory 504, and message memory 506) and utilize M' CN circuits 510 to perform CN processing for M' rows of the parity check matrix at a time. Decoder circuit 418 may then re-use the M' CN circuits 510 to perform CN processing for M' further rows of the parity check matrix. Routing network 512 may be realized as a programmable routing network, which decoder circuit 418 may utilize to route certain VN circuits 502 to specific CN circuits 510 depending on which M' rows of the parity check matrix decoder circuit 418 is currently processing at any given time.

Accordingly, decoder circuit 418 may include N VN circuits 502 and M'<M CN circuits 510, and accordingly may include a dedicated VN circuit 502 for each $VN_i$, i=1, 2, ..., N while re-using the M' CN circuits 510. Each dedicated VN circuit 502 may thus have a dedicated prior memory 508 (such as a dedicated posterior register), dedicated posterior memory 504 (such as a dedicated posterior register) and a dedicated message memory 506 (such as a dedicated message register), and accordingly may calculate V2C messages and update the posterior (e.g. as $\hat{x}_i$) for a given $VN_i$. As decoder circuit 418 contains M'<M CN circuits 510 (rendering decoder circuit 418 partially parallel), decoder circuit 418 may re-use the M' CN circuits 510 in order to process one or more rows of parity check matrix H at a time. For example, decoder circuit 418 may contain N=672 VN circuits 502 and M'=42 CN circuits 510 to decode a (672,336) LDPC code. As decoder circuit 418 may need to reuse the M' CN circuits 510 to perform parity check processing for each of the 336 CNs (corresponding to the 336 rows of H), decoder circuit 418 may process e.g. up to 42 rows of H at a time, with each of the 42 CN circuits 510 performing the CN processing for a distinct row of H, e.g. assuming the role of a given $CN_j$, $j \in \{1, 2, \ldots, M\}$. Decoder circuit 418 may utilize routing network 512 as a programmable routing network to route the corresponding VN circuits 502 to each CN circuit 510 depending on which VNs each CN circuit 510 depends on (where each CN circuit 510 assumes the role of a given $CN_j$). Decoder circuit 408 may thus divide parity check matrix H into 8 layers of 42 rows each and process each layer separately. Similar realizations with different M' selections and divisions of parity check matrix H are possible.

In row parallel realizations, decoder circuit 418 may require more than one cycle per iteration as each row of the parity check matrix is separately processed. Accordingly, decoder circuit 418 may need to utilize 5-10 clock cycles per iteration, but as a result of the reduced hardware requirements may have lower routing complexity for routing network 512 and improved energy and area efficiency. Decoder circuit 418 may be similarly modified to process different numbers of rows of the parity check matrix at a time, such as e.g. one row, two rows, three rows, etc., (which may each allow for a different quantity of CN circuits 510) and accordingly may offer corresponding tradeoffs between the number of clock cycles required per iteration (thus affecting throughput) and energy/area efficiency.

Figure 8:
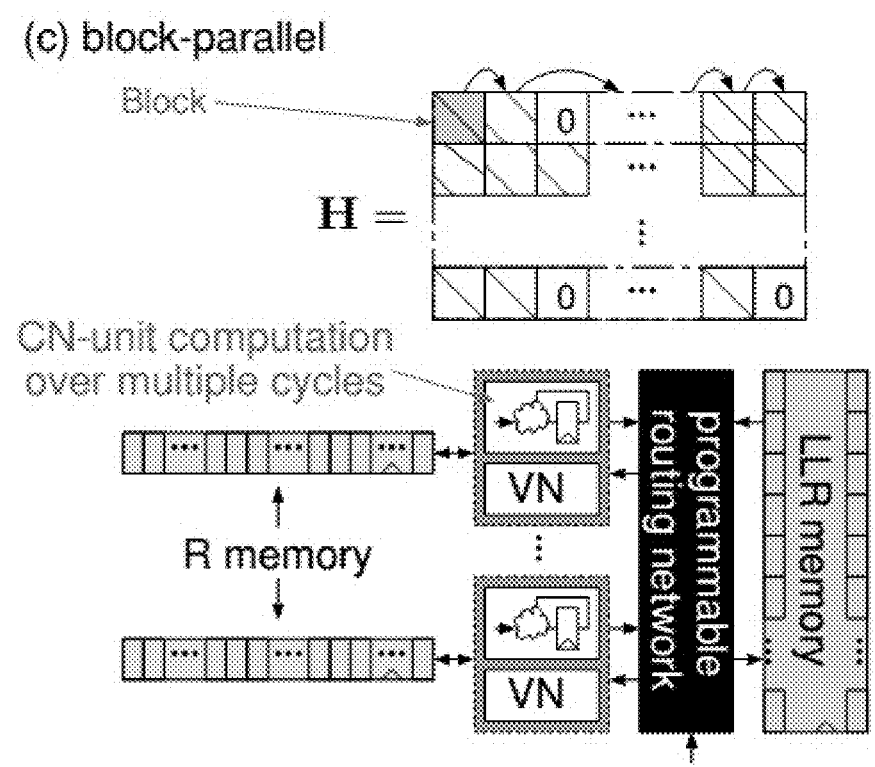
FIG. 8 shows a block-parallel realization of a decoder circuit.

Alternatively, decoder circuit 418 may be realized as a "block parallel" architecture as shown in FIG. 8, which may allow decoder circuit 418 to further reduce the hardware area requirement at the expense of low throughput and poor efficiency, such as e.g. by including N'<N VN circuits 502 and M'<M CN circuits 510. In such a block parallel realization, decoder circuit 418 may process only a small section of the parity channel matrix at a time and may perform CN computation over multiple cycles. It is noted that decoder circuit 418 is not limited to any one realization, and thus may be practically implemented according to any fully parallel or partially parallel (any non-fully parallel) architecture. As will be detailed regarding FIGS. 11 and 12, partially parallel architectures may be suitable for pipelined scheduling in order to effectively utilize the hardware of decoder circuit 418.

Figure 9:
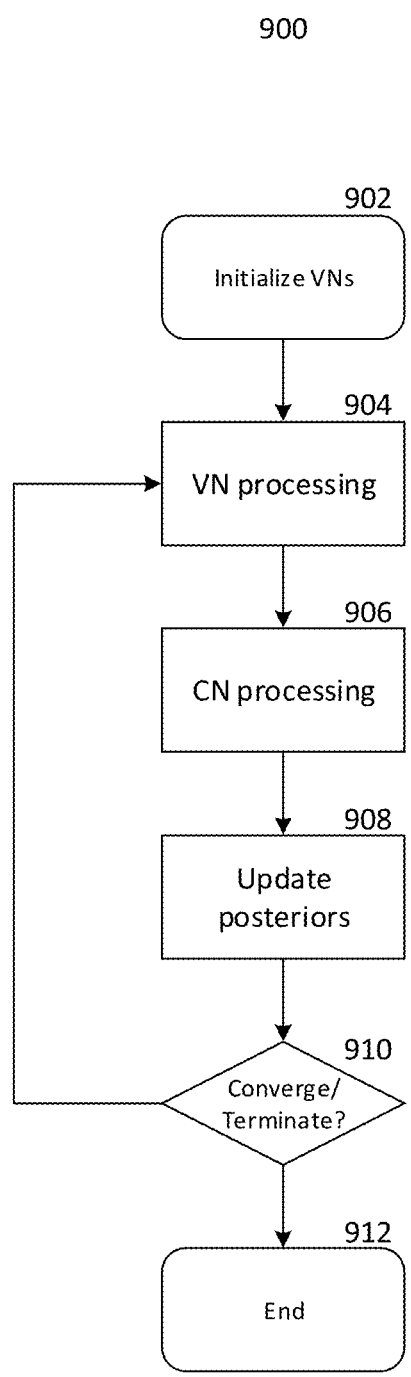
FIG. 9 shows a method for decoding linear block codes with a fully parallel decoder.

Regardless of the specific realization of decoder circuit 418, decoder circuit 418 may be configured to perform the perform VN processing for each $VN_i$, i=1, 2, ..., N), CN processing for each $CN_j$, j=1, 2, ..., M (whether simultaneously or sequentially), and determine if the current estimated codeword (by virtue of the current posterior probabilities at each VN) has converged to a valid codeword during each BP decoding iteration. Decoder circuit 418 may thus execute the BP decoding procedure according to method 900 as shown in FIG. 9, which may correspond to a BP decoding procedure for a fully parallel architecture (where partially parallel architectures will be later detailed). Decoder circuit 418 may initialize each VN as a prior probability based on the received codeword and observed channel information in 902, perform VN processing for each VN in 904 (generating the outgoing V2C messages from each VN), perform CN processing in 906 (generating the outgoing C2V messages from each CN), update posteriors for each VN at 908, check for convergence (all parity check equations satisfied based on the poster probability at each VN) or termination (maximum number of iterations of 904-910) at 910, and end at 912. As previously indicated, decoder circuit 418 may perform the VN processing in 904 at for each $VN_i$, i=1, 2, ..., N and each $CN_j$, j=1, 2, ..., M.

Decoder circuit 418 may utilize Log Likelihood Ratios (LLRs) for CN and VN processing, and accordingly may represent the posterior for each VN in addition to each V2C and C2V as an LLR. Each received codeword at decoder circuit 418 may be represented as a sequence $y=(y_2, y_2, \ldots, y_N)$, where each $y_i$, $i=1, 2, \ldots, N$ corresponds to a bit $x_i$ of the original codeword (at encoder circuit 406) represented as sequence $x=(x_1, x_2, \ldots, x_N)$. The estimated codeword may thus be denoted as $\hat{x}=(\hat{x}_1, \hat{x}_2, \ldots \hat{x}_N)$, where each $\hat{x}_i$ corresponds to the posterior probability of a respective $VN_i$. Decoder circuit 418 may thus update 2 during each iteration by updating the posterior probability of each VN based on the C2V ("adjustment values") provided to each VN from the connected CNs.

Decoder circuit 418 may initialize a prior probability (for storing in prior memory 508) for each VN in 902 based on received vector y and observed channel information of channel 410, and may subsequently update the prior probability for each VN as a posterior probability based on the C2V messages received at each VN from each connected CN. Decoder circuit 418 may initialize the prior probability for each VN as a Log Likelihood Ratio (LLR) as follows:

$$L(\hat{x}_i) = \log\left(\frac{P(x_i = 0 \mid y_i)}{P(x_i = 1 \mid y_i)}\right), \quad (1)$$

where $P(x_i=0|y)$ denotes the conditional probability that original codeword bit $x_i=0$ given received codeword bit $y_i$, and $P(x_i=1 \; y_i)$ denotes the conditional probability that original codeword bit $x_i=1$ given received codeword bit $y_i$. Accordingly, positive values for $L(\hat{x}_i)$ indicate that $x_i$ is probabilistically likely to equal 0 and negative values for $L(\hat{x}_i)$ indicate that $x_i$ is probabilistically likely to equal 1. Furthermore, the magnitude of each $L(\hat{x}_i)$ indicates the reliability of the estimated bit $x_i$, where $L(\hat{x}_i)$ with larger magnitude indicate an increased certainty that $x_i$ is equal to 0 or 1 depending on the corresponding sign of $L(\hat{x}_i)$. Decoder circuit 418 may determine the probabilities $P(x_i=0|y_i)$ and $P(x_i=1|y_i)$ based on observed channel information of channel 410, such based on a crossover probability p for a Binary Symmetric Channel (BSC) or a variance $\sigma^2$ for an Additive White Gaussian-NOISE (AWGN) channel.

Each VN may thus utilize the prior probability as the initial V2C provided to each connected CN, and may subsequently receive each C2V as an LLR adjustment value with which to update the prior probability. BP decoding may thus include multiple iterations of V2C and C2V message passing, during which each VN updates its posterior probability based on each received C2V and provides each connected CN with a V2C based on the updated posterior probability.

As detailed in "Modified Min-sum Decoding Algorithm for LDPC Codes Based on Classified Correction" by Zhong et al. ("Modified Min-sum"), in a standard BP decoding procedure each CN may need to execute an inverse hyperbolic tangent computation to generate each C2V (see Equation 2 of "Modified Min-sum"), thus requiring relatively complex configurations of each CN circuit 510 of decoder circuit 418 that may not be practically realizable. In order to simplify, decoder circuit 418 may instead realize a minimum-sum algorithm (which itself is a simplification of the sum-product algorithm) at each CN to approximate BP decoding (see Equation 6 of "Modified Min-sum"). Specifically, decoder circuit 418 may calculate each V2C as $$V2C_{i,j} = L(\hat{x}_i) + \sum_{\substack{j' \in \text{connected} \\ CN \setminus CN_j}} C2V_{j',i'} \quad (2)$$

where $V2C_{i,j}$ is the V2C from $VN_i$ to $CN_j$, $L(\hat{x}_i)$ is the current LLR posterior probability for $VN_i$, and $$\sum_{\substack{j' \in \text{connected} \\ CN \setminus CN_j}} C2V_{j',i}$$

the sum of all C2V messages received by $VN_i$ excluding $C2V_{j,i}$ received at $VN_i$ from $CN_j$.

Decoder circuit 418 may calculate each C2V as $$C2V_{i,j} = \prod_{\substack{j' \in \text{connected} \\ CN \setminus CN_j}} \text{sign}(V2C_{i,j'}) \cdot \min_{\substack{j' \in \text{connected} \\ CN \setminus CN_j}} |V2C_{i,j'}|, \quad (3)$$

where $$\prod_{\substack{j' \in \text{connected} \\ CN \setminus CN_j}} \text{sign}(V2C_{i,j'})$$

is the product of the signs of each V2C received by $CN_j$ excluding $V2C_{i,j}$ and $$\min_{\substack{j' \in \text{connected} \\ CN \setminus CN_j}} |V2C_{i,j'}|$$

is the minimum absolute-value V2C received by $CN_j$ excluding $V2C_{i,j}$ received at $CN_j$ from $VN_i$.

Decoder circuit 418 may update the $L(\hat{x}_i)$ for each $VN_i$ as $$V2C_{i,j} = L(\hat{x}_i) + \sum_{\substack{j' \in \text{connected} \\ CN}} C2V_{j',i'} \quad (4)$$

where $$\sum_{\substack{j' \in \text{connected} \\ CN}} C2V_{j',i}$$

is the sum of all received C2Vs.

Accordingly, decoder circuit 418 may hold a posterior probability $L(\hat{x}_i)$ for each $VN_i$ (at posterior memory 504) and subsequently update each $L(\hat{x}_i)$ during each decoding iteration by adding the current posterior probability $L(\hat{x}_i)$ to each received C2V (stored at message memory 506) at 904. Decoder circuit 418 may then generate the outgoing V2Cs at 904 from each $VN_i$ as the updated posterior probability $L(\hat{x}_i)$ minus the C2V received from the destination $CN_j$. Decoder circuit 418 may then generate the outgoing C2Vs at 906 at each $CN_j$ as the product of all of the signs of the incoming V2Cs excluding the C2V received from the destination $VN_i$ (which may be calculated by decoder circuit 418 as an XOR checking for even parity) multiplied by the magnitude of the smallest (minimum-valued) incoming V2C excluding the C2V received from the destination $VN_i$.

Decoder circuit 418 may check in 910 whether the estimated codeword $\hat{x}$ (represented by the $L(\hat{x}_i)$ at each $VN_i$, i=1, 2, . . . , N) has converged to a valid codeword at convergence detection circuit 514 (which may be configured to access posterior memory 504 and/or routing network 512 in order to access the current posterior values for each VN). As previously indicated, positive LLR values ($L(\hat{x}_i)>0$) may correspond to logical 0 bits while negative LLR values ($L(\hat{x}_i)<0$) may correspond to logical 1 bits. Decoder circuit 418 may thus logically quantize each $L(\hat{x}_i)$ to obtain the current $\hat{x}$ and determine if $\hat{x} \cdot H^T = 0$, which indicates that 2 is a valid codeword in 910 and, if so, may end at 912. Decoder circuit 418 may proceed to 904 to execute the next decoding iteration (V2C generation, and C2V generation, and posterior update) if $\hat{x} \cdot H^T \neq 0$. Decoder circuit 418 may additionally have a termination criteria, such as a maximum number of iterations, that may trigger decoder circuit 418 to terminate at 910. Accordingly, if $\hat{x}$ has not converged to a valid codeword after a maximum number of iterations have completed, decoder circuit 418 may declare a decoding failure and end at 912.

Figure 10:
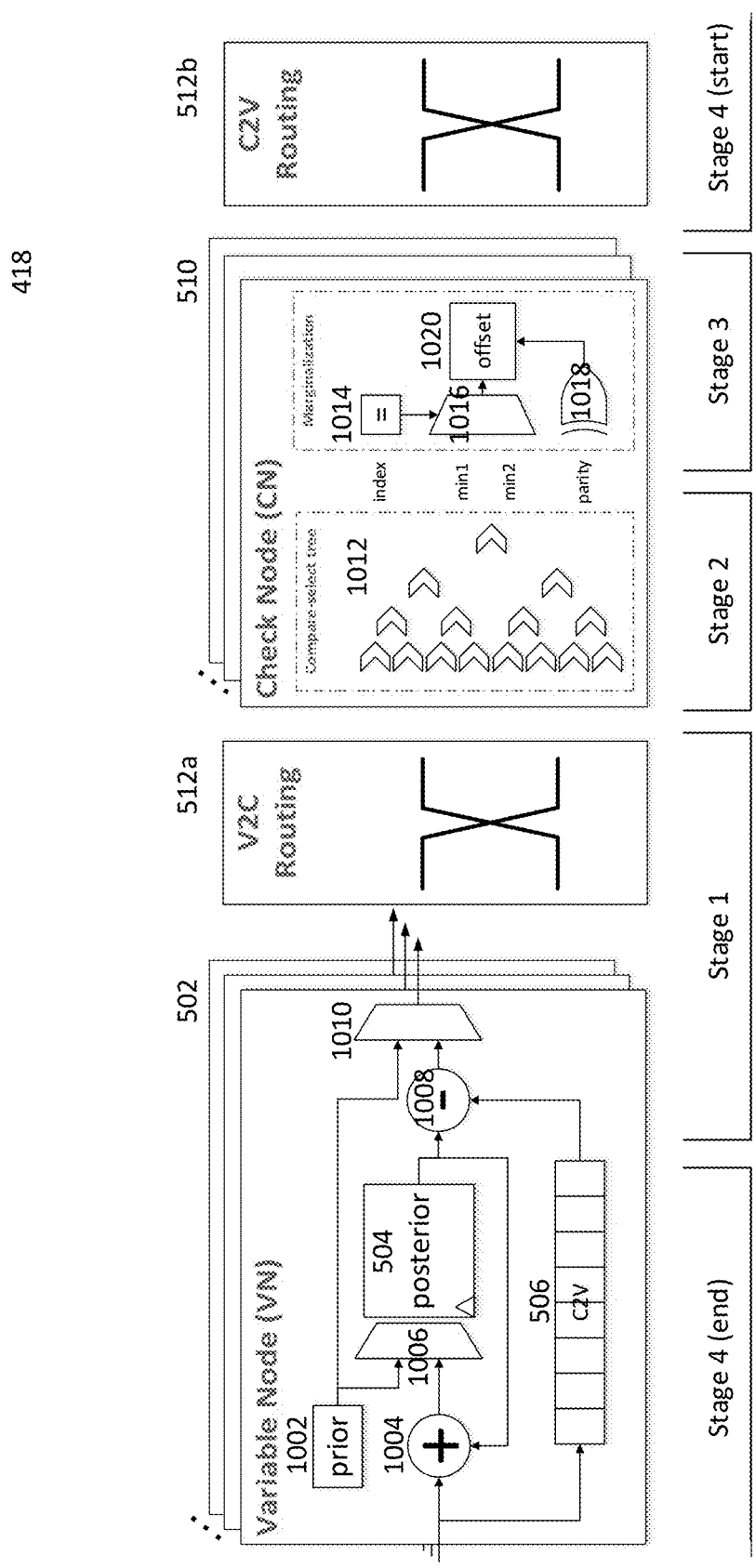
FIG. 10 shows an internal configuration of a decoder circuit.

FIG. 10 shows a realization of decoder circuit 418 as configured to execute a minimum-sum algorithm as detailed above. As shown in FIG. 10, each VN circuit 502 may be composed of prior input 1002 (which may be prior memory 508 for storing the prior probability; accessed once per input), adder 1004, multiplexer 1006, subtractor 1008, multiplexer 1010, posterior memory 504, and message memory 506. Each VN circuit 502 may be configured to generate one or more V2C messages according to the number of connected CNs for the corresponding CN. As previously indicated, decoder circuit 418 may include N dedicated VN circuits 502, i.e. one for each $VN_i$, i=1, 2, . . . , N, which accordingly may each include a dedicated posterior memory 504 and dedicated message memory 506 to hold posterior and C2V data for a given $VN_i$. Each VN circuit 502 may thus be able to perform VN processing for a given $VN_i$. Decoder circuit 418 may analogously implement CN circuits 510, i.e. M CN circuits 510 (fully parallel) or M' CN circuits 510 (partially parallel). For example, decoder circuit 418 may include e.g. N=672 VN circuits 502 and M'=42 CN circuits 510 to implement a row parallel hardware architecture for processing up to 42 rows (e.g. one "layer") of parity check matrix H at a time.

Multiplexer 1010 may be configured to select the V2C to provide to each destination CN for $VN_i$. As previously indicated, each VN may provide a prior probability as the initial V2C during the first decoding iteration, where the prior probability is an LLR L(i) according to the received bit $y_i$ and observed channel information and may be provided to prior input 1002. Multiplexer 1010 may therefore select the prior probability provided by prior input 1002 as the V2C for VN circuit 502 during the first decoding iteration, and may select the value provided by subtractor 1008 during all subsequent iterations. Similarly, multiplexer 1006 may be configured to select the probability to store as the posterior probability for the VN in posterior memory 504. Accordingly, multiplexer 1006 may select to store the prior probability provided by prior input 1002 as the posterior probability for the VN in posterior memory 504 during the first decoding iteration, and may select to store the value provided by adder 1004 in all subsequent iterations.

VN circuit 502 may update the posterior probability stored in posterior memory 504 during each iteration following the initial iteration (Equation (4)). As shown in FIG. 10, VN circuit 502 may update the posterior probability by adding the current posterior probability to all received C2V messages for $VN_i$ at adder 1004. VN circuit 502 may thus update the posterior probability stored in posterior memory 504 as the sum of the LLRs of the current posterior probability and each received C2V.

VN circuit 502 may additionally need to provide each connected CN with a V2C indicating the updated posterior probability. In order to avoid sending a V2C message to a CN that directly depends (by way of adder 1004) on the C2V (stored in message memory 506) provided by the CN, VN circuit 502 may subtract the connected C2V from the updated posterior probability with subtractor 1008 to obtain the V2C to provide to each CN. Multiplexer 1010 may thus select the output of subtractor 1008 to provide as the V2C from the VN for each iteration following the initial iteration (Equation (2)).

VN circuit 502 may then provide the resulting V2C message(s) to routing network 512, which as depicted in FIG. 10 may correspond to a V2C routing section 512a of routing network 512. V2C routing section 512a may then route the V2C messages provided by each VN circuit 502 to each connected CN circuit 510. CN circuit 510 for a given $CN_j$ may then receive the V2C messages from each of the connected $d_{c,j}$ VN circuits 502. As previously indicated, CN circuit 510 may realize a minimum-sum algorithm in order to simplify the complex hyperbolic tangent operations of standard BP decoding. As shown in FIG. 10, CN circuit 510 may include compare-select tree 1012, multiplexer 1016, index selector 1014, parity evaluator 1018, and offset generator 1020.

As previously detailed, a given $CN_j$ may receive V2C messages from each of the $d_{C,j}$ connected VNs and subsequently provide a C2V message back to each connected VN. Each provided C2V may be an LLR adjustment value for each connected VN to utilize to update its posterior probability. Similarly to as detailed regarding the subtraction of C2V messages received from destination CNs by subtractor 1008 in VN circuit 502, CN circuit 510 may be configured to ignore the V2C provided by a given destination VN during calculation of the responsive C2V message to provide to the destination VN. CN circuit 510 may calculate a C2V message for a destination $VN_i$ by identifying the smallest magnitude received V2C other than the V2C received from the destination $VN_i$ and providing either this smallest magnitude V2C or the additive inverse (negative) of this smallest magnitude V2C as the C2V to the destination $VN_i$ (Equation (3)).

Compare-select tree 1012 may be configured to compare each received V2C message for $CN_j$ in order to identify minimum V2Cs. As shown in FIG. 10, compare-select tree 1012 may be configured to identify the two V2C LLR values with the smallest magnitudes, $min_1$ (the V2C LLR with the smallest magnitude) and $min_2$ (the V2C LLR with the second smallest magnitude), to provide to multiplexer 1016. Index selector 1014 may then provide multiplexer 1016 with selection control based on the destination $VN_i$ of the C2V message in order to ensure that multiplexor 1016 does not select a V2C received from the destination $VN_i$ as $min_1$ or $min_2$. Accordingly, multiplexer 1016 may select $min_1$ or $min_2$ to provide to offset generator 1020 based on which of $min_1$ or $min_2$ provides a better estimated reliability.

Offset generator 1020 may also receive input from parity evaluator 1018, which may be realized as an XOR gate as shown in FIG. 10. Parity evaluator 1018 may be configured to evaluate the parity check equation for $CN_j$ based on the $d_{c,j}$ V2C messages received from each connected VN. As previously indicated, each V2C message may be an LLR, where positive LLR values indicate a 0 bit and negative LLR values indicate a 1 bit. Accordingly, parity evaluator 1018 may evaluate the parity check equation for $CN_j$ by evaluating whether the product of each received V2C is negative or positive, which may be equivalently calculated by determining whether the XOR of the logical representation of each V2C (0 for positive-valued V2Cs and 1 for negative-valued V2Cs) is equal to zero (parity check satisfied) or 1 (parity check failed).

If parity evaluator 1018 determines that the parity check for $CN_j$ is satisfied, offset generator 1020 may provide the C2V message to the destination $VN_i$ as the minimum-valued V2C LLR other than the V2C LLR received from the destination $VN_i$ along with an offset for algorithmic correction. If parity evaluator 1018 determines that the parity check for $CN_j$ is not satisfied, offset generator 1020 may provide the C2V message to the destination $VN_i$ as the additive-inverse of the minimum-valued V2C LLR other than the V2C LLR received from the destination $VN_i$ along with an offset for algorithmic correction. As shown in FIG. 10, CN circuit 510 may provide the C2V message via C2V routing section 512b of routing network 512. Similarly to as detailed above regarding VN circuit 502, each CN circuit 510 may calculate the $d_{c,j}$ C2V messages for each connected VN in serial or may only calculate a single C2V message (thus requiring decoder circuit 418 to include multiple CN circuits 510 to provide the $d_{c,j}$ C2V messages for a given $CN_j$).

Each VN circuit 502 may thus receive the C2V messages provided by the CN circuits 510 on C2V routing section 512, and may subsequently update the posterior probability for $VN_i$ stored in posterior memory 504 as the sum of the current posterior probability and each of the $d_{v,i}$ received C2Vs.

Decoder circuit 418 may thus update the posterior probability for each of the N VNs during each iteration. The length of each iteration may depend on whether decoder circuit 418 is realized as a fully parallel architecture or a partially parallel architecture.

Figure 11:
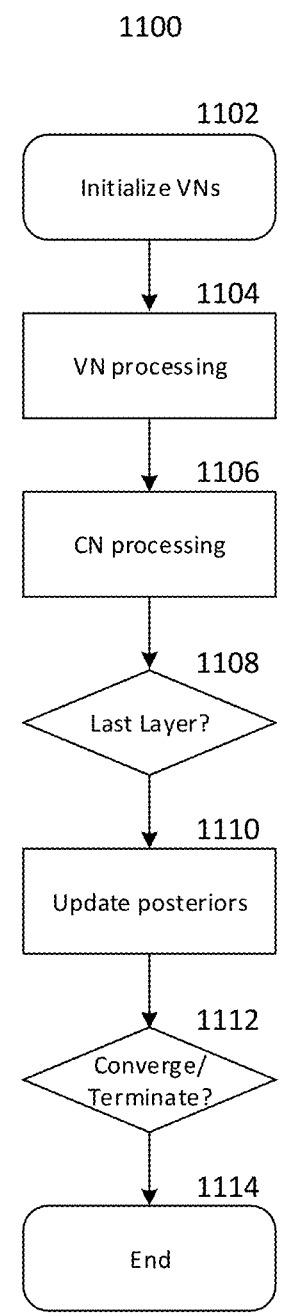
FIG. 11 shows a method for decoding linear block codes with a partially parallel decoder.

Method 900 as previously detailed may correspond to a fully parallel architecture, where decoder circuit 418 may be able to perform VN and CN processing as well as posterior updates simultaneously for all N VNs and all M CNs due to the availability of N VN circuits 502 and M CN circuits 510. Decoder circuit 418 may need to alter the BP decoding procedure for partially parallel architectures due to the reduced hardware availability. FIG. 11 shows method 1100, which illustrates BP decoding at decoder circuit 418 for row-parallel architectures.

Decoder circuit 418 may similarly initialize the prior probability for each VN at a respective one of VN circuits 502 in 1102, which may include initializing the prior probability for each VN based on the received codeword and observed channel information and storing the prior probability in prior memory 508 for each VN (e.g. storing the prior probability for each VN at a dedicated prior memory 508 at each VN circuit).

Decoder circuit 418 may then begin VN and CN processing for a given layer of the parity check matrix, which may correspond to M'<M rows (M' CNs) of the parity check matrix. Accordingly, decoder circuit 418 may generate V2C messages at VN circuits 502 for each of the VNs that are connected with each of the M' CNs of the current layer in 1104. As decoder circuit 418 may only include M' CN circuits 510, decoder circuit 418 may need to reuse CN circuits 510 for each layer. Accordingly, decoder circuit 418 may assign each of the M' CN circuits 510 to a respective CN of the current layer, and subsequently utilize routing network 512 to route the V2Cs from 1104 to the respective CN circuits 510.

Decoder circuit 418 may then perform CN processing in 1106 at each of the M' CN circuits 510 based on the V2Cs routed from 1104, which may include calculating C2V messages at each CN circuit 510 for each connected VN circuit 502 according to BP decoding as detailed above. Decoder circuit 418 may then route the C2Vs to the connected VN circuits 502 with routing network 512.

Decoder circuit 418 may perform 1104 and 1106 in an iterative manner, and may continue to perform 1104 and 1106 for each layer until each layer of the parity check matrix has been processed. Decoder circuit 418 may thus check in 1108 whether the most recently completed layer is the last layer of the parity check matrix and, if not, may return to 1104 and 1106 to perform VN and CN processing for the next layer of the parity check matrix.

Decoder circuit 418 may perform an update of the posterior probabilities of each VN circuit 502 once per iteration, i.e. once per processing of each layer. Accordingly, if decoder circuit 418 determines in 1108 that the last layer of the parity check matrix has been processed, decoder circuit 418 may proceed to 1110 to update the posterior probabilities of each VN circuit 502 based on the existing posterior probabilities and the C2V messages generated for each of the M CNs during the most recent iteration.

After updating the posterior probabilities for each VN, decoder circuit 418 may check whether the current estimated codeword $\hat{x}$ is a valid codeword based on the current posterior probability of each VN in 1112 and, if the current estimated codeword is a valid codeword, may end at 1114. Alternatively, if the current estimated codeword $\hat{x}$ is not a valid codeword, decoder circuit 418 may proceed to perform another iteration by processing each VN and CN on a layer-by-layer basis in 1104 and 1106 to perform another posterior probability update for each VN.

Partially parallel realizations of decoder circuit 418 may be suitable for pipelined scheduling in order to effectively utilize the hardware components of decoder circuit 418, in particular for row-parallel architectures. For example, as shown in FIG. 10 decoder circuit 418 may be partitioned into e.g. a four stage pipeline where each stage of the pipeline is configured to perform a specific computational stage on one layer composed of M' rows of the parity check matrix. In the first pipeline stage, each VN circuit 502 may generate the V2C messages for destination CNs according to a specific layer (subtractor 1008 and multiplexer 1010) and V2C routing section 512a may route the V2Cs messages to destination CN circuits 510 according to which CNs each of CN circuits 510 have been assigned for the current pipeline stage. In the second pipeline stage, CN circuits 510 may perform the compare-select operation at compare-select tree 1012. In the third pipeline stage, CN circuits 510 may perform marginalization (at index selector 1014, multiplexer 1016, parity evaluator 1018, and offset generator 1020) in order to generate the C2V messages for the VNs of the current layer. In the fourth pipeline stage, C2V routing section 512b may route the C2V messages to the destination VNs of VN circuits 502 which may subsequently write the received C2V messages to message memory 506. As will be later detailed, each pipeline stage may be separated by a register to hold the results from the previous pipeline stage to provide to the next pipeline stage during the next clock cycle. Although such a 4-stage pipeline may be referenced below, it is noted that decoder circuit 418 may be realized with numerous different pipeline architectures that vary with respect to the number of pipeline stages, the components of each pipeline stage, the operations performed by each pipeline stage, etc.

Figure 12A:
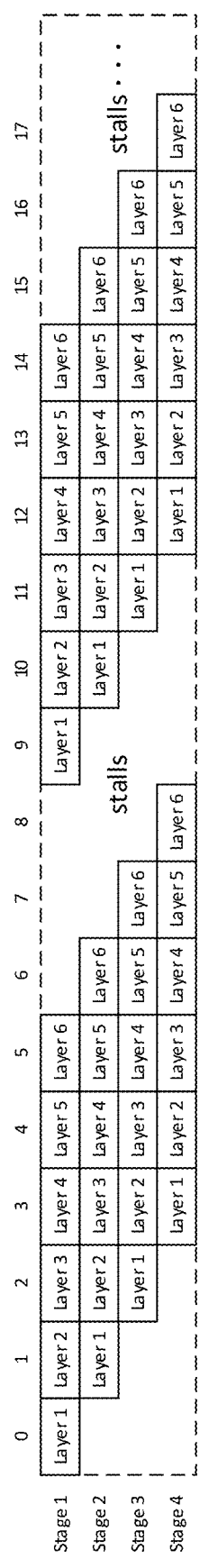
FIGS. 12A-12C show various pipeline scheduling schemes.

Decoder circuit 418 may be able to implement different pipeline scheduling schemes for the BP decoding procedure detailed in FIG. 11, such as "flooding" and "layered" scheduling schemes that are conventionally employed for BP decoding. FIG. 12A shows pipeline schedule diagram 1200 that illustrates flooding scheduling for a 4-stage pipeline, where each row of pipeline schedule diagram 1200 corresponds to a pipeline stage of decoder circuit 418 and each column of pipeline schedule diagram 1200 corresponds to a clock cycle.

Each pipeline stage of decoder circuit 418 may be configured to process VN and CN data for one layer (out of e.g. six total layers in the exemplary pipeline schedules of FIG. 12) during a single clock cycle, where one layer may correspond to M' rows of the parity check matrix. Decoder circuit 418 may thus also include flip-flop registers placed between each pipeline stage (not explicitly shown in FIG. 5 or 10) to hold the results from each pipeline stage until the next clock cycle edge, when each flip-flop register may provide the stored results to the next pipeline stage.

In accordance with flooding scheduling in a row-parallel architecture, decoder circuit 418 may sequentially process each layer in the pipeline, where a 4-stage pipeline as illustrated in pipeline scheduling diagram 1200 of FIG. 12*a* may allow decoder circuit 418 to process up to four layers at a time in separate pipeline stages. Decoder circuit 418 may hold the results of each pipeline stage in a register separating each consecutive pipeline stage and subsequently feed the results stored in the register to the next pipeline stage for the next clock cycle. Accordingly, decoder circuit 418 may calculate the V2C (e.g. pipeline stage 1) and C2V messages (e.g. pipeline stages 2 and 3) for each layer and provide the resulting C2V messages back to the corresponding VNs (e.g. pipeline stage 4) for each layer in sequential fashion.

Once decoder circuit 418 has processed each of the layers to obtain all the C2V messages for each of the M VNs (e.g. in clock cycle 8), decoder circuit 418 may update the posterior values at each VN circuit 502 simultaneously in parallel. However, in order to allow the posterior for each VN to be updated in parallel, decoder circuit 418 may need to stall the pipeline in between each iteration in order to allow decoder circuit 418 to finish processing the final layers. As shown in pipeline scheduling diagram 1200, decoder circuit 418 may need to stall for e.g. three pipeline cycles until the fourth pipeline stage has finished processing Layer 6 before feeding Layer 1 back to the first pipeline stage, which may allow for decoder circuit 418 (e.g. at pipeline stage 4) to finish calculating the C2V messages for Layer 6. Decoder circuit 418 may therefore avoid data dependency issues that may arise if e.g. Layer 1 depends on the same VNs as Layer 6, as decoder circuit 418 may not be able to update the posteriors for the VNs of Layer 6 until pipeline cycle 8 when the C2V messages for Layer 6 are available. Decoder circuit 418 may continue to process each layer in accordance with flooding scheduling until either the estimated codeword converges to a valid codeword or a termination condition is reached.

Figure 12B:
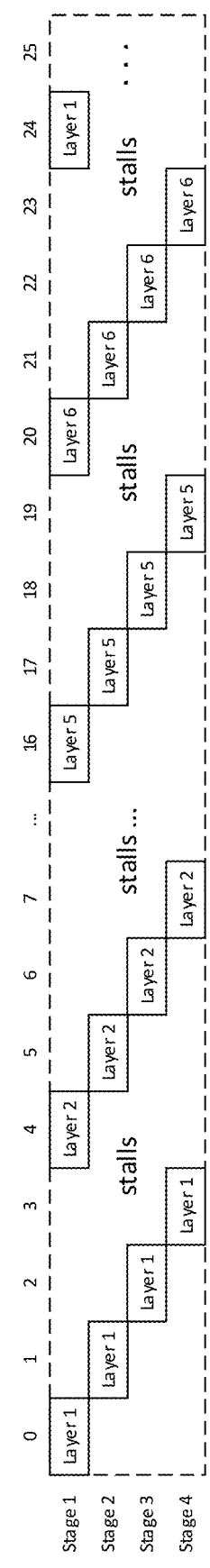

Decoder circuit 418 may alternatively utilize a layered scheduling scheme as illustrated by pipeline scheduling diagram 1210 in FIG. 12*b*. In a layered scheme, decoder circuit 418 may update the posterior values of the VNs following the completion of each layer in the pipeline, which differs from the flooding scheme detailed above in which decoder circuit 418 delays posterior update until all of the layers have been processed. Accordingly, in a layered scheme decoder circuit 418 may calculate V2C and C2V messages for a single layer and subsequently update the related VNs of the layer as soon as the layer is ready to exit the pipeline. As a result, decoder circuit 418 may update each VN related to the current layer based on both newly obtained C2V messages (from the processing of the current layer in the pipeline) and old C2V messages (from previous processing of other layers).

As shown in FIG. 12*b*, decoder circuit 418 may additionally need to utilize pipeline stalls in order to avoid data dependencies between layers. As decoder circuit 418 may update the VNs for a given layer as soon as the layer is ready to exit the pipeline, decoder circuit 418 may not be able to enter the next layer into the pipeline until after the VNs for the current layer are updated. Without pipeline stalls, decoder circuit 418 may calculate C2V messages for updating a particular VN based on an outdated posterior value of the VN. For example, if Layer 1 and Layer 2 both depend on a given $VN_i$, decoder circuit 418 may update the posterior of $VN_i$ at e.g. clock cycle 3 for Layer 1. However, if decoder circuit 418 entered Layer 2 into the pipeline immediately after Layer 1 (e.g. clock cycle 1), decoder circuit 418 may additionally have calculated V2C messages and C2V messages based on the previous posterior value of $VN_i$ (prior to the update for Layer 1), and accordingly may update the posterior value of $VN_i$ at clock cycle 4 based on these outdated V2C and C2V messages. In order to avoid such issues arising from data dependencies, decoder circuit 418 may instead introduce pipeline stalls to ensure that the posterior values for each VN are current before generating V2C and C2V messages for a new layer.

As shown in FIG. 12*b*, decoder circuit 418 may continue to separately process each layer while updating the related VNs for each layer at pipeline exit. Decoder circuit 418 may similarly check for codeword convergence, which decoder circuit 418 may perform in between each iteration, i.e. after decoder circuit 418 has processed each layer once (e.g. at clock cycle 23 in pipeline scheduling diagram 1210).

While decoder circuit 418 may need to introduce more pipeline stalls for layered scheduling than flooding scheduling, decoder circuit 418 may be able to obtain faster convergence of the estimated codeword x̂ as the VNs for each layer are updated sequentially in parallel. Accordingly, layered scheduling may converge e.g. twice as fast as flooding scheduling with similar Bit Error Rates (BERs).

Regardless, the pipeline stalls required for flooding and layered scheduling may decrease the throughput potential of decoder circuit 418. In order to reduce pipeline stalls and subsequently increase throughput, decoder circuit 418 may instead utilize a "hybrid" scheduling scheme that ignores the data dependencies between layers in order to eliminate pipeline stalls and allow for seamless update of VN posteriors. Furthermore, decoder circuit 418 may reduce the resolution of the pipeline to employ "coarse" pipeline stages, such as by allocating decoder circuit 418 into two pipeline stages (as will be detailed regarding FIG. 13) instead of four pipeline stages (as previously detailed regarding FIG. 10). As decoder circuit 418 may ignore data dependencies between layers, a coarse pipeline may allow decoder circuit 418 to in part reduce dependency to prevent excessive performance degradation (i.e. as fewer layers are present in the pipeline at each given clock cycle). It is nevertheless noted that decoder circuit 418 may alternatively utilize the hybrid scheduling scheme without coarse pipelining.

Figure 12C:
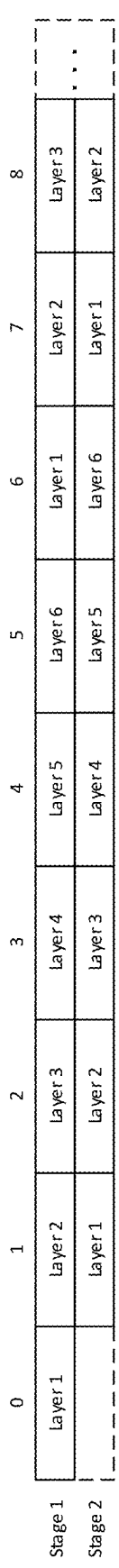

Pipeline scheduling diagram 1220 in FIG. 12c illustrates the hybrid scheduling scheme employed by decoder circuit 418. As depicted by pipeline scheduling diagram 1220, decoder circuit 418 may immediately enter the next layer into the pipeline as soon as the current layer is ready to move to the next pipeline stage. As opposed to waiting until each layer is complete as in the case of flooding scheduling, decoder circuit 418 may perform the posterior update for each layer at pipeline exit, and accordingly may update the VNs for each exiting layer at each clock cycle. Decoder circuit 418 may thus ignore any data dependencies between layers, as hybrid scheduling may result in decoder circuit 418 utilizing outdated posterior values for V2C and C2V generation (e.g. if the immediately previous layer depends on a given $VN_1$ with the next layer, which would result in the previous layer updating the posterior value of $VN_1$ simultaneous to the next layer generating V2C and C2V messages based on the un-updated posterior value of $VN_i$. Accordingly, decoder circuit 418 may ignore the potential of such data dependencies and continue to enter subsequent layers into the pipeline without introducing pipeline stalls, and thus may potentially generate V2C messages before the posterior of the VN is updated. Decoder circuit 418 may similarly check for convergence after each iteration is complete (e.g. clock cycle 7 in pipeline scheduling diagram 1220).

Decoder circuit 418 configured according to such a hybrid scheduling may thus allow for update seamless update of VN posteriors as in flooding scheduling while allowing messages to propagate deeply through layers as in layered scheduling. Furthermore, as pipeline stalls are eliminated, decoder circuit 418 may increase throughput at the expense of a slight performance degradation stemming from ignoring of data dependencies between layers (e.g. using outdated data for a layer before decoder circuit 418 has completed updating the layer). However, the performance degradation may be minimal and may even be recovered by allowing decoder circuit 418 to perform more iterations (e.g. by increasing termination criteria).

Accordingly, decoder circuit 418 may implement hybrid scheduling in order to increase throughput, and may additionally employ coarse pipelining in order to reduce data dependencies between layers that are simultaneously processed in the pipeline (as a coarse pipeline may result in less layers being concurrently processed). It is noted that hybrid scheduling may not be limited to row-parallel architectures and may be analogously implemented for pipeline scheduling in any partially parallel architecture.

As previously indicated, LDPC codes have seen increased usage in various communications standards, which may be characterized as "fixed-throughput" applications, i.e. have a target throughput rate as specified by a particular standard. Accordingly, an LDPC decoder may need to provide a throughput capability to meet the target throughput rate; however, providing throughputs above the target throughput rate may not be beneficial due to the "fixed" throughput nature of communication protocols.

Accordingly, decoder circuit 418 may be able obtain "excess" throughput by implementing a hybrid scheduling scheme (and optionally a coarse pipeline). As such excess throughput may not be particularly beneficial in fixed-throughput applications, decoder circuit 418 may trade the excess throughput in order to allow for a reduction in power, and may consequently improve the energy efficiency of decoder circuit 418.

Decoder circuit 418 may need to have a sufficient supply voltage in order to operate effectively. In particular, decoder circuit 418 may need adequate power in order to ensure that the computations of each pipeline stage are completed within each clock cycle, where decoder circuit 418 may fail if pipeline computations are not completed in time. Due to variations in Process, Voltage, and Temperature (PVT) in addition to signal integrity and delay model uncertainty, the computation times required for each pipeline stage may not remain strictly constant and may increase the likelihood that a critical path (longest pipeline stage) will exceed the clock edge. Furthermore, PVT variations may increase in severity as technology is scaled to smaller areas, in particular for sub-40 nm technologies. As the pipeline stage computation times are prone to variation, conventional solutions may introduce unrealistic design margins in order to prevent critical paths from causing timing violations. Accordingly, conventional solutions may include a voltage guard band (of e.g. 10-15%) in the supply voltage in order to ensure that the pipeline stages consistently are provided with sufficient voltage to meet the computational requirements imparted by the clock frequency. While such may allow the pipeline to avoid timing violations, such a voltage guard band constitutes a conservative, "worst-case" approach that results in significant power overhead and difficulty in design closure.

As previously indicated, decoder circuit 418 may implement pipeline stages by including flip-flop registers in between each pipeline stage, which may require each pipeline stage to finish computations by the next clock edge due to the edge-triggered nature of flip-flops. Alternatively, in order to eliminate the voltage and timing margins detailed above, decoder circuit 418 may instead be realized as a latch-based pipeline in order to exploit time-borrowing between neighboring pipeline stages. As latches are level-triggered as opposed to edge-triggered flip-flops, decoder circuit 418 may avoid timing violations caused by critical paths missing clock edges and instead allow certain latched pipeline stages to borrow time from neighboring pipeline stages. As a result, decoder circuit 318 may be able to implement dynamic voltage scaling (DVS) in order to operate with reduced supply voltage (available due to the excess throughput) without experiencing excessive timing violations.

Figure 13:
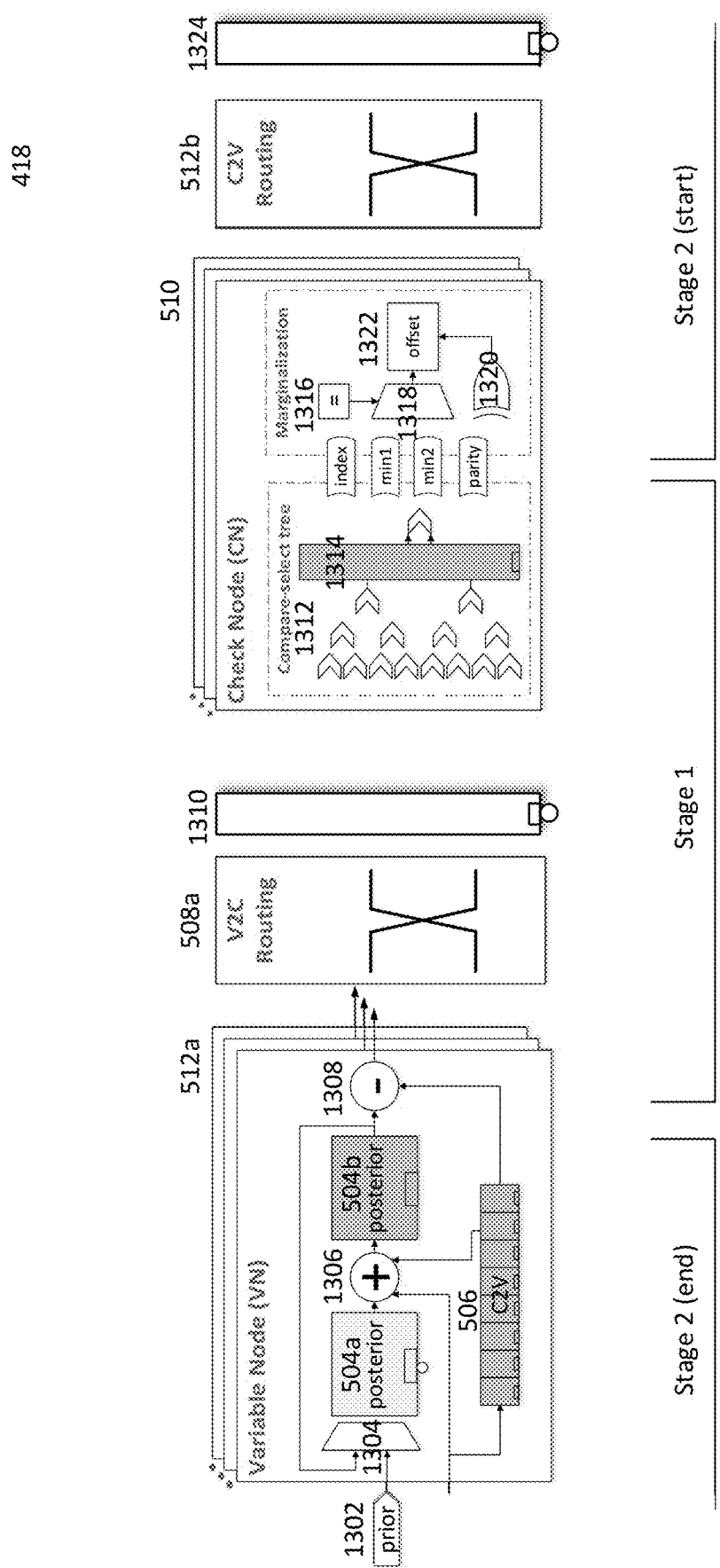
FIG. 13 shows a further internal configuration of a decoder circuit.

FIG. 13 shows a two-stage pipeline latch-based configuration of decoder circuit 418 that utilizes master-slave latches to separate each pipeline stage. As shown in FIG. 13, as opposed to placing a flip-flop register between each pipeline stage, decoder circuit 418 may break such flip-flops into master and slave latches in posterior memory latches 504a (active-low) and 504b (active-high), message memory latch 506 (active-high), latch 1310 (active-low), latch 1314 (active-high), and latch 1324 (active-low). Decoder circuit 418 may then operate prior input 1302 (which may be prior memory 508 for storing the prior probability), multiplexer 1304, subtractor 1308, V2C routing section 512a, compare select tree 1312, index selector 1316, multiplexer 1318, parity evaluator 1320, offset generator 1322, and C2V routing section 512b as detailed above regarding the counterpart components of decoder circuit 418 in FIG. 10. As shown in FIG. 13, decoder circuit 418 may generate V2C messages, perform V2C routing, and perform compare-select processing in the first pipeline stage, and may perform marginalization (to generate C2V messages), C2V routing, and posterior updated in the second pipeline stage.

Decoder circuit 418 may therefore employ posterior memory latches 504a and 504b and message memory latch 506 in addition to latches 1310, 1314, and 1324 to implement a soft-edged pipeline in which data from each pipeline stage can arrive at the next latch after the clock edge. Accordingly, if PVT variations cause the data to arrive after the clock edge, a given pipeline stage of decoder circuit 418 may "borrow" the time. Decoder circuit 418 may thus operate without a substantial guard band and utilize dynamic time-borrowing between pipeline stages in order to avoid timing violations.

It is noted that the specific configuration of the pipeline stages of decoder circuit 418 may be selected to "balance" the pipeline such that each pipeline stage requires a similar amount of time to complete, which may include balancing between the logic—(VN circuits 502 and CN circuits 510) and wire-dominant (routing network 512) pipeline stages, such as by selecting the location of the latches such that a similar amount of computation takes place between each active-high and active-low latch. It is noted that decoder circuit 418 is not limited to a specific pipeline configuration and that FIG. 13 represents one such option.

Accordingly, decoder circuit 418 implemented with a latch-based pipeline may eliminate the need for voltage and timing guard bands and thus allow for aggressive DVS and reduced power requirements. Decoder circuit 418 may thus utilize excess throughput available via hybrid scheduling in order to reduce the necessary supply voltage of decoder circuit 418 and consequently improve energy efficiency. It is noted that decoder circuit 418 may implement hybrid scheduling separately from coarse pipelining and/or latch-based pipelining.

Figure 14:
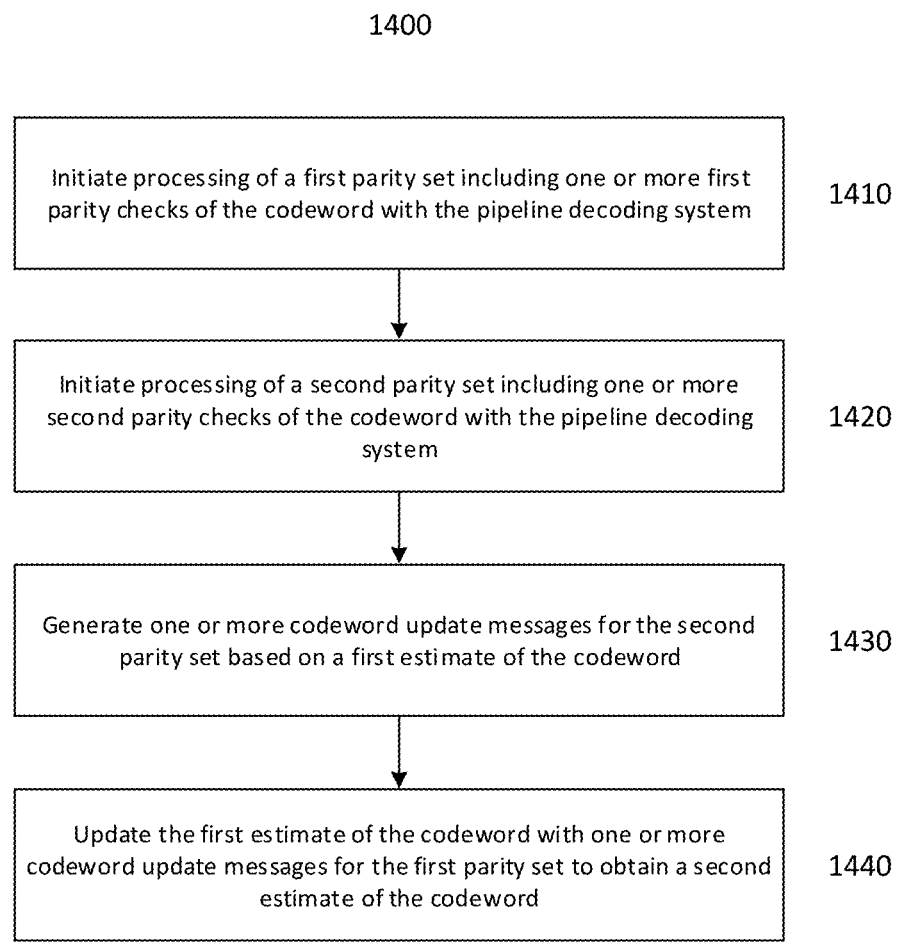
FIG. 14 shows a method for performing decoding.

FIG. 14 shows method 1400 for performing decoding of a codeword with a pipelined decoding system including a plurality of pipeline decoding stages each configured to perform a respective pipeline decoding stage for one or more parity checks. As shown in FIG. 14, method 1400 includes initiating processing of a first parity set composed of one or more first parity checks of the codeword with the pipeline decoding system (1410), initiating processing of a second parity set composed of one or more second parity checks of the codeword with the pipeline decoding system (1420), generating one or more codeword update messages for the second parity set based on a first estimate of the codeword (1430), and updating the first estimate of the codeword with one or more codeword update messages for the first parity set to obtain a second estimate of the codeword (1440).

In one or more further exemplary aspects of the disclosure, one or more of the features described above in reference to FIGS. 1-13 may be further incorporated into method 1400. In particular, method 1400 may be configured to perform further and/or alternate processes as detailed regarding decoder circuit 418.

Figure 15:
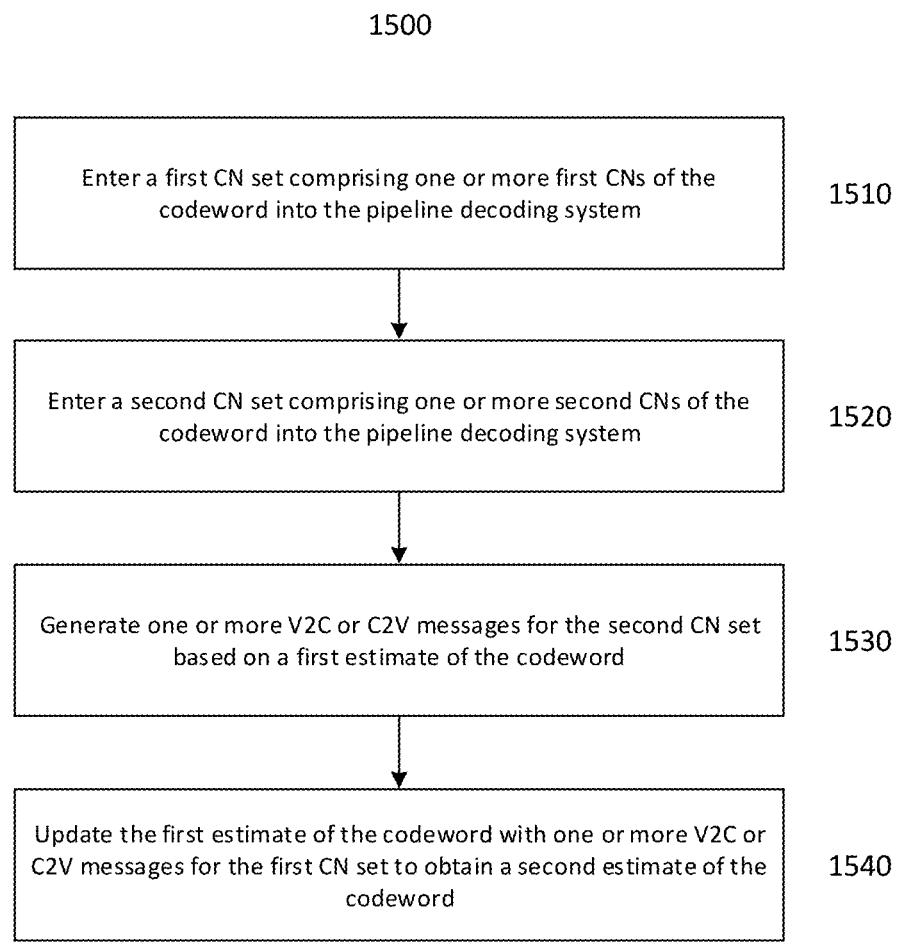
FIG. 15 shows a further method for performing decoding.

FIG. 15 shows method 1500 for performing decoding of a codeword with a pipelined decoding system composed of a plurality of pipeline decoding stages each configured to perform a respective pipeline decoding stage for one or more Check Nodes (CNs). As shown in FIG. 15, method 1500 includes entering a first CN set composed of one or more first CNs of the codeword into the pipeline decoding system (1510), entering a second CN set composed of one or more second CNs of the codeword into the pipeline decoding system (1520), generating one or more V2C or C2V messages for the second CN set based on a first estimate of the codeword (1530), and updating the first estimate of the codeword with one or more V2C or C2V messages for the first CN set to obtain a second estimate of the codeword (1540).

In one or more further exemplary aspects of the disclosure, one or more of the features described above in reference to FIGS. 1-13 may be further incorporated into method 1500. In particular, method 1500 may be configured to perform further and/or alternate processes as detailed regarding decoder circuit 418.

It is appreciated that the terms "user equipment", "UE", "mobile terminal", etc., may apply to any wireless communication device, including cellular phones, tablets, laptops, personal computers, wearables, multimedia playback devices, consumer/home appliances, vehicles, etc., and any number of additional electronic devices capable of wireless communications.

It is appreciated that implementations of methods detailed herein are demonstrative in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include a one or more components configured to perform each aspect of the related method.

The following examples pertain to further aspects of the disclosure:

Example 1 is a method for performing decoding of a codeword with a pipelined decoding system including a plurality of pipeline decoding stages each configured to perform a respective pipeline decoding stage for one or more parity checks, the method including initiating processing of a first parity set including one or more first parity checks of the codeword with the pipeline decoding system, initiating processing of a second parity set including one or more second parity checks of the codeword with the pipeline decoding system, generating one or more codeword update messages for the second parity set based on a first estimate of the codeword, updating the first estimate of the codeword with one or more codeword update messages for the first parity set to obtain a second estimate of the codeword.

In Example 2, the subject matter of Example 1 can optionally include wherein the initiating processing of a second parity set including one or more second parity checks of the codeword with the pipeline decoding system includes initiating processing of the second parity set after initiating processing of the first parity set with the pipeline decoding system.

In Example 3, the subject matter of Example 1 or 2 can optionally include wherein the updating the first estimate of the codeword with one or more codeword update messages for the first parity set to obtain a second estimate of the codeword includes updating the first estimate of the codeword with the one or more codeword update messages for the first parity set to obtain the second estimate of the codeword before the pipeline decoding system finishes processing the second parity set.

In Example 4, the subject matter of any one of Examples 1 to 3 can optionally include wherein the codeword is a linear block codeword.

In Example 5, the subject matter of any one of Examples 1 to 4 can optionally include wherein the one or more first parity checks and the one or more second parity checks correspond to one or more Check Nodes of the codeword.

In Example 6, the subject matter of any one of Examples 1 to 5 can optionally include wherein the first estimate of the codeword corresponds to one or more Variable Nodes of the codeword.

In Example 7, the subject matter of Example 6 can optionally include wherein the first estimate of the codeword corresponds to posterior values of the one or more Variable Nodes.

In Example 8, the subject matter of any one of Examples 1 to 4 can optionally include wherein the first estimate of the codeword is composed of one or more logical bits, and wherein each logical bit of the first estimate of the codeword corresponds to a respective Variable Node of the codeword.

In Example 9, the subject matter of any one of Examples 1 to 8 can optionally include wherein the codeword is a low-density parity check (LDPC) codeword.

In Example 10, the subject matter of any one of Examples 1 to 9 can optionally include wherein the one or more codeword update messages are Variable-to-Check messages or Check-to-Variable messages.

In Example 11, the subject matter of any one of Examples 1 to 10 can optionally include wherein the first parity set and the second parity set are mutually exclusive.

In Example 12, the subject matter of any one of Examples 1 to 11 can optionally include wherein the first parity set depends on a first bit set including one or more bits of the codeword and the second parity set depends on a second bit set including one or more bits of the codeword, and wherein the first bit set and the second bit set are not mutually exclusive.

In Example 13, the subject matter of any one of Examples 1 to 11 can optionally include wherein the first parity set depends on a first bit set including one or more bits of the codeword and the second parity set depends on a second bit set including one or more bits of the codeword, and wherein the first bit set and the second bit set are mutually exclusive.

In Example 14, the subject matter of any one of Examples 1 to 13 can optionally further include obtaining an updated estimate of the codeword during each of a plurality of iterations to obtain a decoded estimate of the codeword.

In Example 15, the subject matter of Example 14 can optionally further include determining whether the updated estimate of the codeword of each iteration of the plurality of iterations is a valid codeword.

In Example 16, the subject matter of Example 15 can optionally further include terminating decoding during a given iteration of the plurality of iterations if the updated estimate of the codeword is a valid codeword, and selecting the updated estimate of the codeword as the decoded estimate of the codeword.

In Example 17, the subject matter of Example 15 can optionally include wherein the determining whether the updated estimate of the codeword of the current iteration is a valid codeword includes determining whether the updated estimate of the codeword of the current iteration satisfies the one or more first parity checks and the one or more second parity checks.

In Example 18, the subject matter of any one of Examples 1 to 13 can optionally include wherein the codeword corresponds to a plurality of parity checks, and wherein the plurality of parity checks include the first parity set and the second parity set.

In Example 19, the subject matter of Example 18 can optionally further include determining whether the first estimate of the codeword or the second estimate of the codeword is a valid codeword according to the plurality of parity checks.

In Example 20, the subject matter of Example 18 can optionally further include processing each of the plurality of parity checks with the pipeline decoding system until convergence or termination without any pipeline stalls.

In Example 21, the subject matter of any one of Examples 1 to 13 can optionally further include applying the first parity set and the second parity set to determine whether the first estimate or the second estimate of the codeword is a valid codeword.

In Example 22, the subject matter of any one of Examples 1 to 21 can optionally include wherein the initiating processing of a first parity set including one or more first parity checks of the codeword with the pipeline decoding system includes initiating processing of the first parity set at an initial pipeline stage of the pipeline decoding system.

In Example 23, the subject matter of Example 22 can optionally include wherein the initiating processing of a second parity set including one or more second parity checks of the codeword with the pipeline decoding system after initiating processing of the first parity set with the pipeline decoding system includes initiating processing of the second parity set at the initial pipeline stage of the pipeline decoding system.

In Example 24, the subject matter of Example 1 can optionally include wherein the one or more first parity checks and the one or more second parity checks correspond to one or more Check Nodes of the codeword and wherein the first estimate of the codeword corresponds to posterior values of one or more Variable Nodes of the codeword at a first time.

In Example 25, the subject matter of Example 24 can optionally include wherein the generating one or more codeword update messages for the second parity set based on a first estimate of the codeword includes generating one or more Check-to-Variable messages for the second parity set according to the posterior values of the one or more Variable Nodes at the first time.

In Example 26, the subject matter of Example 24 or 25 can optionally include wherein the updating the first estimate of the codeword with one or more codeword update messages for the first parity set to obtain a second estimate of the codeword before the pipeline decoding system finishes processing the second parity set includes updating the posterior values of the one or more Variable Nodes with the one or more Check-to-Variable messages.

In Example 27, the subject matter of Example 24 can optionally include wherein the second estimate of the codeword corresponds to posterior values of the one or more Variable Nodes at a second time occurring after the first time.

In Example 28, the subject matter of Example 24 can optionally include wherein the initiating processing of a first parity set including one or more first parity checks of the codeword with the pipeline decoding system includes generating one or more Variable-to-Check messages for the one or more first parity checks.

In Example 29, the subject matter of Example 24 can optionally include wherein the initiating processing of a second parity set including one or more second parity checks of the codeword with the pipeline decoding system after initiating processing of the first parity set with the pipeline decoding system includes generating one or more Variable-to-Check messages for the one or more second parity checks.

In Example 30, the subject matter of any one of Examples 1 to 13 can optionally further include updating the second estimate of the codeword with the one or more codeword update messages for the second parity set to obtain a third estimate of the codeword.

In Example 31, the subject matter of Example 30 can optionally include wherein the updating the second estimate of the codeword with the one or more codeword update messages for the second parity set to obtain a third estimate of the codeword includes updating the second estimate of the codeword after updating the first estimate of the codeword.

In Example 32, the subject matter of any one of Examples 1 to 31 can optionally further include generating the one or more codeword update messages for the first parity set.

In Example 33, the subject matter of any one of Examples 1 to 32 can optionally include wherein the generating one or more codeword update messages for the second parity set based on a first estimate of the codeword includes applying the first estimate of the codeword to generate the one or more codeword update messages for the second parity set according to a belief propagation decoding algorithm.

In Example 34, the subject matter of any one of Examples 1 to 32 can optionally include wherein the generating one or more codeword update messages for the second parity set based on a first estimate of the codeword includes applying the first estimate of the codeword to generate the one or more codeword update messages for the second parity set according to a sum-product decoding algorithm.

In Example 35, the subject matter of any one of Examples 1 to 32 can optionally include wherein the generating one or more codeword update messages for the second parity set based on a first estimate of the codeword includes applying the first estimate of the codeword to generate the one or more codeword update messages for the second parity set according to a minimum-sum decoding algorithm.

In Example 36, the subject matter of any one of Examples 1 to 32 can optionally include wherein the updating the first estimate of the codeword with one or more codeword update messages for the first parity set to obtain a second estimate of the codeword before pipeline decoding system finishes processing the second parity set includes updating the first estimate of the codeword with the one or more codeword update messages according to a belief propagation decoding algorithm.

In Example 37, the subject matter of any one of Examples 1 to 32 can optionally include wherein the updating the first estimate of the codeword with one or more codeword update messages for the first parity set to obtain a second estimate of the codeword before the pipeline decoding system finishes processing the second parity set includes updating the first estimate of the codeword with the one or more codeword update messages according to a sum-product decoding algorithm.

In Example 38, the subject matter of any one of Examples 1 to 32 can optionally include wherein the updating the first estimate of the codeword with one or more codeword update messages for the first parity set to obtain a second estimate of the codeword before the pipeline decoding system finishes processing the second parity set includes updating the first estimate of the codeword with the one or more codeword update messages according to a minimum-sum decoding algorithm.

Example 39 is a pipeline decoding system for performing pipelined decoding of a codeword characterized by one or more parity checks, the pipelined decoding system including a first circuit configured to process a first parity set including one or more first parity checks of the codeword and to process a second parity set including one or more second parity checks of the codeword, a second circuit configured to generate one or more codeword update messages for the second parity set based on a first estimate of the codeword, and a third circuit configured to update the first estimate of the codeword with one or more codeword update messages for the first parity set to obtain a second estimate of the codeword In Example 40, the subject matter of Example 39 can optionally include wherein the first circuit is configured to process the second parity set after processing the first parity set.

In Example 41, the subject matter of Example 39 or 40 can optionally include wherein the third circuit is configured to update the first estimate of the codeword with the one or more codeword update messages for the first parity set to obtain the second estimate of the codeword before the pipeline decoding system finishes processing the second parity set.

In Example 42, the subject matter of any one of Examples 39 to 41 can optionally include wherein the pipeline decoding system includes a plurality of circuits including the first circuit, the second circuit, and the third circuit, and wherein the pipeline decoding system further includes a latch-based register configured to store results between at least two of the plurality of circuits.

In Example 43, the subject matter of any one of Examples 39 to 41 can optionally include wherein the pipeline decoding system includes a plurality of circuits including the first circuit, the second circuit, and the third circuit, and wherein the pipeline decoding system further includes a plurality of latch-based registers each configured to separate neighboring circuits of the plurality of circuits.

In Example 44, the subject matter of Example 43 can optionally include wherein at least two of the plurality of circuits are configured to utilize one of the plurality of latch-based registers for pipeline time-borrowing.

In Example 45, the subject matter of any one of Examples 39 to 44 can optionally include wherein the codeword is a linear block codeword.

In Example 46, the subject matter of any one of Examples 39 to 45 can optionally include wherein the one or more codeword update messages are Variable-to-Check messages or Check-to-Variable messages.

In Example 47, the subject matter of any one of Examples 39 to 46 can optionally include wherein the one or more first parity checks and the one or more second parity checks correspond to one or more Check Nodes of the codeword.

In Example 48, the subject matter of any one of Examples 39 to 47 can optionally include wherein the first estimate of the codeword corresponds to one or more Variable Nodes of the codeword.

In Example 49, the subject matter of Example 48 can optionally include wherein the first estimate of the codeword corresponds to posterior values of the one or more Variable Nodes.

In Example 50, the subject matter of any one of Examples 39 to 49 can optionally include wherein the first estimate of the codeword is composed of one or more logical bits, and wherein each logical bit of the first estimate of the codeword corresponds to a respective Variable Node of the codeword.

In Example 51, the subject matter of any one of Examples 39 to 51 can optionally include wherein the codeword is a low-density parity check (LDPC) codeword.

In Example 52, the subject matter of any one of Examples 39 to 51 can optionally include wherein the first parity set and the second parity set are mutually exclusive.

In Example 53, the subject matter of any one of Examples 39 to 52 can optionally include wherein the first parity set depends on a first bit set including one or more bits of the codeword and the second parity set depends on a second bit set including one or more bits of the codeword, and wherein the first bit set and the second bit set are not mutually exclusive.

In Example 54, the subject matter of any one of Examples 39 to 52 can optionally include wherein the first parity set depends on a first bit set including one or more bits of the codeword and the second parity set depends on a second bit set including one or more bits of the codeword, and wherein the first bit set and the second bit set are mutually exclusive.

In Example 55, the subject matter of any one of Examples 39 to 54 can optionally include wherein the third circuit is configured to obtain an updated estimate of the codeword during each of a plurality of iterations to obtain a decoded estimate of the codeword.

In Example 56, the subject matter of Example 55 can optionally further include a convergence detection circuit configured to determine whether the updated estimate of the codeword of each iteration of the plurality of iterations is a valid codeword.

In Example 57, the subject matter of Example 56 can optionally include wherein the convergence detection circuit is further configured to terminate decoding during a given iteration of the plurality of iterations if the updated estimate of the codeword is a valid codeword, and select the updated estimate of the codeword as the decoded estimate of the codeword.

In Example 58, the subject matter of Example 56 can optionally include wherein the convergence detection circuit is configured to determine whether the updated estimate of the codeword of each iteration of the plurality of iterations is a valid codeword by determining whether the updated estimate of the codeword of the current iteration satisfies the one or more first parity checks and the one or more second parity checks.

In Example 59, the subject matter of any one of Examples 39 to 58 can optionally include wherein the codeword corresponds to a plurality of parity checks, and wherein the plurality of parity checks include the first parity set and the second parity set.

In Example 60, the subject matter of Example 59 can optionally further include a convergence detection circuit configured to determine whether the first estimate of the codeword or the second estimate of the codeword is a valid codeword according to the plurality of parity checks.

In Example 61, the subject matter of Example 60 can optionally include wherein the pipeline decoding system is configured to process each of the plurality of parity checks until convergence or termination without any pipeline stalls.

In Example 62, the subject matter of any one of Examples 39 to 54 can optionally further include a convergence detection circuit configured to apply the first parity set and the second parity set to determine whether the first estimate or the second estimate of the codeword is a valid codeword.

In Example 63, the subject matter of any one of Examples 39 to 62 can optionally include wherein the first circuit is the initial pipeline stage of the pipeline decoding system.

In Example 64, the subject matter of any one of Examples 39 to 63 can optionally include wherein the third circuit is the final pipeline stage of the pipeline decoding system.

In Example 65, the subject matter of Example 39 can optionally include wherein the one or more first parity checks and the one or more second parity checks correspond to one or more Check Nodes of the codeword and wherein the first estimate of the codeword corresponds to posterior values of one or more Variable Nodes of the codeword at a first time.

In Example 66, the subject matter of Example 65 can optionally include wherein the second circuit is configured to generate the one or more codeword update messages for the second parity set based on the first estimate of the codeword by generating one or more Check-to-Variable messages for the second parity set according to the posterior values of the one or more Variable Nodes at the first time.

In Example 67, the subject matter of Example 65 or 66 can optionally include wherein the third circuit is configured to update the first estimate of the codeword with the one or more codeword update messages for the first parity set to obtain the second estimate of the codeword before the pipeline decoding system finishes processing the second parity set includes updating the posterior values of the one or more Variable Nodes with the one or more Check-to-Variable messages.

In Example 68, the subject matter of Example 65 can optionally include wherein the second estimate of the codeword corresponds to posterior values of the one or more Variable Nodes at a second time occurring after the first time.

In Example 69, the subject matter of Example 65 can optionally include wherein the first circuit is configured to initiate processing of the first parity set by generating posterior values of estimated bits of the codeword for the one or more first parity checks.

In Example 70, the subject matter of Example 65 can optionally include wherein the second circuit is configured to initiate processing of the second parity set after processing the first parity set by generating posterior values of estimated bits of the codeword for the one or more second parity checks.

In Example 71, the subject matter of any one of Examples 39 to 70 can optionally include wherein the third circuit is further configured to update the second estimate of the codeword with the one or more codeword update messages for the second parity set to obtain a third estimate of the codeword.

In Example 72, the subject matter of Example 71 can optionally include wherein the third circuit is configured to update the second estimate of the codeword with the one or more codeword update messages for the second parity set to obtain the third estimate of the codeword after updating the first estimate of the codeword.

In Example 73, the subject matter of any one of Examples 39 to 72 can optionally include wherein the second circuit is further configured to generate the one or more codeword update messages for the first parity set.

In Example 74, the subject matter of any one of Examples 39 to 73 can optionally include wherein the second circuit is configured to generate the one or more codeword update messages for the second parity set based on the first estimate of the codeword by applying the first estimate of the codeword to generate the one or more codeword update messages for the second parity set according to a belief propagation decoding algorithm, a minimum-sum decoding algorithm, or a sum-product decoding algorithm.

In Example 75, the subject matter of any one of Examples 39 to 63 can optionally include wherein the third circuit is configured to update the first estimate of the codeword with the one or more codeword update messages for the first parity set to obtain a second estimate of the codeword before the pipeline decoding system finishes processing the second parity set by updating the first estimate of the codeword with the one or more codeword update messages according to a belief propagation decoding algorithm, a minimum-sum decoding algorithm, or a sum-product decoding algorithm.

Example 76 is a method for performing decoding of a codeword with a pipelined decoding system including a plurality of pipeline decoding stages each configured to perform a respective pipeline decoding stage for one or more Check Nodes, the method including entering a first Check Node set including one or more first Check Nodes of the codeword into the pipeline decoding system, entering a second Check Node set including one or more second Check Nodes of the codeword into the pipeline decoding system Check Node, generating one or more Variable-to-Check or Check-to-Variable messages for the second Check Node set based on a first estimate of the codeword, updating the first estimate of the codeword with one or more Variable-to-Check or Check-to-Variable messages for the first Check Node set to obtain a second estimate of the codeword before the pipeline decoding system finishes processing the second Check Node set.

In Example 77, the subject matter of Example 76 can optionally include wherein the entering a second Check Node set including one or more second Check Nodes of the codeword into the pipeline decoding system includes entering the second Check Node set into the pipeline decoding system after entering the first Check Node set into the pipeline decoding system In Example 78, the subject matter of Example 76 or 77 can optionally include wherein the updating the first estimate of the codeword with one or more Variable-to-Check or Check-to-Variable messages for the first Check Node set to obtain a second estimate of the codeword includes updating the first estimate of the codeword with the one or more Variable-to-Check or Check-to-Variable messages for the first Check Node set to obtain the second estimate of the codeword before the pipeline decoding system finishes processing the second Check Node set In Example 79, the subject matter of any one of Examples 76 to 78 can optionally include wherein the codeword is a linear block codeword.

In Example 80, the subject matter of any one of Examples 76 to 79 can optionally include wherein the first estimate of the codeword corresponds to one or more Variable Nodes of the codeword.

In Example 81, the subject matter of Example 80 can optionally include wherein the first estimate of the codeword corresponds to posterior values of the one or more Variable Nodes.

In Example 82, the subject matter of any one of Examples 76 to 79 can optionally include wherein the first estimate of the codeword is composed of one or more logical bits, and wherein each logical bit of the first estimate of the codeword corresponds to a respective Variable Node of the codeword.

In Example 83, the subject matter of any one of Examples 76 to 82 can optionally include wherein the codeword is a low-density parity check (LDPC) codeword.

In Example 84, the subject matter of any one of Examples 76 to 83 can optionally include wherein the first Check Node set and the second Check Node set are mutually exclusive.

In Example 85, the subject matter of any one of Examples 76 to 84 can optionally include wherein the first Check Node set depends on a first bit set including one or more bits of the codeword and the second Check Node set depends on a second bit set including one or more bits of the codeword, and wherein the first bit set and the second bit set are not mutually exclusive.

In Example 86, the subject matter of any one of Examples 76 to 84 can optionally include wherein the first Check Node set depends on a first bit set including one or more bits of the codeword and the second Check Node set depends on a second bit set including one or more bits of the codeword, and wherein the first bit set and the second bit set are mutually exclusive.

In Example 87, the subject matter of any one of Examples 76 to 86 can optionally further include obtaining an update estimate of the codeword during each of a plurality of iterations to obtain a decoded estimate of the codeword.

In Example 88, the subject matter of Example 87 can optionally further include determining whether the updated estimate of the codeword of each iteration of the plurality of iterations is a valid codeword.

In Example 89, the subject matter of Example 88 can optionally further include terminating decoding during a given iteration of the plurality of iterations if the updated estimate of the codeword is a valid codeword, and selecting the updated estimate of the codeword as the decoded estimate of the codeword.

In Example 90, the subject matter of Example 88 can optionally include wherein the determining whether the updated estimate of the codeword of the current iteration is a valid codeword includes determining whether the updated estimate of the codeword of the current iteration satisfies the one or more first Check Nodes and the one or more second Check Nodes.

In Example 91, the subject matter of Example 76 can optionally include wherein the codeword corresponds to a plurality of Check Nodes including the one or more first Check Nodes and the one or more second Check Nodes.

In Example 92, the subject matter of Example 91 can optionally further include determining whether the first estimate of the codeword or the second estimate of the codeword is a valid codeword according to the plurality of Check Nodes.

In Example 93, the subject matter of Example 91 can optionally further include processing each of the plurality of Check Nodes with the pipeline decoding system until convergence or termination without any pipeline stalls.

In Example 94, the subject matter of any one of Examples 76 to 93 can optionally further include applying the first Check Node set and the second Check Node set to determine whether first estimate or the second estimate of the codeword is a valid codeword.

In Example 95, the subject matter of any one of Examples 76 to 94 can optionally include wherein the entering a first Check Node set including one or more first Check Nodes of the codeword into the pipeline decoding system includes entering the first Check Node set into an initial pipeline stage of the pipeline decoding system.

In Example 96, the subject matter of Example 95 can optionally include wherein the entering a second Check Node set including one or more second Check Nodes of the codeword into the pipeline decoding system after entering the first Check Node set into the pipeline decoding system includes entering the second Check Node set into the initial pipeline stage of the pipeline decoding system.

In Example 97, the subject matter of Example 76 can optionally include wherein the first estimate of the codeword corresponds to posterior values of one or more Variable Nodes of the codeword at a first time.

In Example 98, the subject matter of Example 97 can optionally include wherein the generating one or more Variable-to-Check or Check-to-Variable messages for the second Check Node set based on a first estimate of the codeword includes generating one or more Check-to-Variable messages for the second Check Node set according to posterior values of the one or more Variable Nodes at the first time.

In Example 99, the subject matter of Example 97 can optionally include wherein the updating the first estimate of the codeword with one or more Variable-to-Check or Check-to-Variable messages for the first Check Node set to obtain a second estimate of the codeword before the pipeline decoding system finishes processing the second Check Node set includes updating the posterior values of the one or more Variable Nodes with the one or more Check-to-Variable messages.

In Example 100, the subject matter of Example 97 can optionally include wherein the second estimate of the codeword corresponds to posterior values of the one or more Variable Nodes at a second time occurring after the first time.

In Example 101, the subject matter of Example 97 can optionally include wherein the entering a first Check Node set including one or more first Check Nodes of the codeword into the pipeline decoding system includes generating one or more Variable-to-Check messages for the one or more first Check Nodes.

In Example 102, the subject matter of Example 97 can optionally include wherein the entering a second Check Node set including one or more second Check Nodes of the codeword into the pipeline decoding system after entering the first Check Node set into the pipeline decoding system includes generating one or more Variable-to-Check messages for the one or more second Check Nodes.

In Example 103, the subject matter of any one of Examples 76 to 102 can optionally further include updating the second estimate of the codeword with the one or more Variable-to-Check or Check-to-Variable messages for the second Check Node set to obtain a third estimate of the codeword.

In Example 104, the subject matter of Example 103 can optionally include wherein the updating the second estimate of the codeword with the one or more Variable-to-Check or Check-to-Variable for the second Check Node set to obtain a third estimate of the codeword includes updating the second estimate of the codeword after updating the first estimate of the codeword.

In Example 105, the subject matter of any one of Examples 76 to 104 can optionally further include generating the one or more Variable-to-Check or Check-to-Variable messages for the first Check Node set.

In Example 106, the subject matter of any one of Examples 76 to 105 can optionally include wherein the generating one or more Variable-to-Check or Check-to-Variable messages for the second Check Node set based on a first estimate of the codeword includes applying the first estimate of the codeword to generate the one or more Variable-to-Check or Check-to-Variable messages for the second Check Node set according to a belief propagation decoding algorithm, a minimum-sum decoding algorithm, or a sum-product decoding algorithm.

In Example 107, the subject matter of any one of Examples 76 to 106 can optionally include wherein the updating the first estimate of the codeword with one or more Variable-to-Check or Check-to-Variable messages for the first Check Node set to obtain a second estimate of the codeword before the pipeline decoding system finishes processing the second Check Node set includes updating the first estimate of the codeword with the one or more Variable-to-Check or Check-to-Variable messages according to a belief propagation decoding algorithm, a minimum-sum decoding algorithm, or a sum-product decoding algorithm.

Example 108 is a pipeline decoding system for performing pipelined decoding of a codeword characterized by one or more Check Nodes and one or more Variable Nodes, the pipelined decoding system including a first circuit configured to process a first Check Node set including one or more first Check Nodes of the codeword and to process a second Check Node set including one or more second Check Nodes of the codeword Check Node, a second circuit configured to generate one or more Check-to-Variable messages for the second Check Node set based on a first estimate of the codeword, and a third circuit configured to update the first estimate of the codeword with one or more Check-to-Variable messages for the first Check Node set to obtain a second estimate of the codeword before the pipeline decoding system finishes processing the second Check Node set.

In Example 109, the subject matter of Example 108 can optionally include wherein the first circuit is configured to process second Check Node set after processing the first Check Node set In Example 110, the subject matter of Example 108 or 109 can optionally include wherein the third circuit is configured to update the first estimate of the codeword with the one or more Check-to-Variable messages for the first Check Node set to obtain the second estimate of the codeword before the pipeline decoding system finishes processing the second Check Node set In Example 111, the subject matter of any one of Examples 108 to 110 can optionally include wherein the pipeline decoding system includes a plurality of circuits including the first circuit, the second circuit, and the third circuit, and wherein the pipeline decoding system further includes a latch-based register configured to store results between at least two of the plurality of circuits.

In Example 112, the subject matter of any one of Examples 108 to 110 can optionally include wherein the pipeline decoding system includes a plurality of circuits including the first circuit, the second circuit, and the third circuit, and wherein the pipeline decoding system further includes a plurality of latch-based registers each configured to separate neighboring circuits of the plurality of circuits.

In Example 113, the subject matter of Example 112 can optionally include wherein at least two of the plurality of circuits are configured to utilize one of the plurality of latch-based registers for pipeline time-borrowing.

In Example 114, the subject matter of any one of Examples 108 to 113 can optionally include wherein the codeword is a linear block codeword.

In Example 115, the subject matter of any one of Examples 108 to 114 can optionally include wherein the first estimate of the codeword corresponds to posterior values of one or more Variable Nodes of the codeword.

In Example 116, the subject matter of any one of Examples 108 to 115 can optionally include wherein the first estimate of the codeword is composed of one or more logical bits, and wherein each logical bit of the first estimate of the codeword corresponds to a respective Variable Node of the codeword.

In Example 117, the subject matter of any one of Examples 108 to 116 can optionally include wherein the codeword is a low-density parity check (LDPC) codeword.

In Example 118, the subject matter of any one of Examples 108 to 117 can optionally include wherein the first Check Node set and the second Check Node set are mutually exclusive.

In Example 119, the subject matter of any one of Examples 108 to 118 can optionally include wherein the first Check Node set depends on one or more first Variable Nodes of the codeword and the second Check Node set depends on one or more second Variable Nodes of the codeword, and wherein the one or more first Variable Nodes and the one or more second Variable Nodes are not mutually exclusive with respect to each other.

In Example 120, the subject matter of any one of Examples 108 to 118 can optionally include wherein the first Check Node set depends on one or more first Variable Nodes of the codeword and the second Check Node set depends on one or more second Variable Nodes of the codeword, and wherein the one or more first Variable Nodes and the one or more second Variable Nodes are mutually exclusive with respect to each other.

In Example 121, the subject matter of any one of Examples 108 to 120 can optionally include wherein the third circuit is configured to obtain an updated estimate of the codeword during each of a plurality of iterations to obtain a decoded estimate of the codeword.

In Example 122, the subject matter of Example 121 can optionally further include a convergence detection circuit configured to determine whether the updated estimate of the codeword of each iteration of the plurality of iterations is a valid codeword.

In Example 123, the subject matter of Example 122 can optionally include wherein the convergence detection circuit is further configured to terminate decoding during a given iteration of the plurality of iterations if the updated estimate of the codeword is a valid codeword, and select the update estimate of the codeword at the given iteration as the decoded estimate of the codeword.

In Example 124, the subject matter of Example 122 can optionally include wherein the convergence detection circuit is configured to determine whether the updated estimate of the codeword of each iteration of the plurality of iterations is a valid codeword by determining whether the updated estimate of the codeword of the current iteration satisfies the one or more first Check Nodes and the one or more Check Nodes.

In Example 125, the subject matter of any one of Examples 108 to 120 can optionally include wherein the codeword corresponds to a plurality of Check Nodes, and wherein the plurality of Check Nodes include the first Check Node set and the second Check Node set.

In Example 126, the subject matter of Example 125 can optionally further include a convergence detection circuit configured to determine whether the first estimate of the codeword or the second estimate of the codeword is a valid codeword according to the plurality of Check Nodes.

In Example 127, the subject matter of Example 126 can optionally include wherein the pipeline decoding system is configured to process each of the plurality of Check Nodes until convergence or termination without any pipeline stalls.

In Example 128, the subject matter of any one of Examples 108 to 127 can optionally further include a convergence detection circuit configured to apply the first Check Node set and the second Check Node set to determine whether the first estimate or the second estimate of the codeword is a valid codeword.

In Example 129, the subject matter of any one of Examples 108 to 128 can optionally include wherein the first circuit is the initial pipeline stage of the pipeline decoding system.

In Example 130, the subject matter of any one of Examples 108 to 129 can optionally include wherein the third circuit is the final pipeline stage of the pipeline decoding system.

In Example 131, the subject matter of Example 108 can optionally include wherein the first estimate of the codeword corresponds to posterior values of one or more Variable Nodes of the codeword at a first time.

In Example 132, the subject matter of Example 131 can optionally include wherein the second circuit is configured to generate the one or more Check-to-Variable messages for the second Check Node set based on the first estimate of the codeword by generating the one or more Check-to-Variable messages for the second Check Node set according to posterior values of one or more Variable Nodes of the codeword at the first time.

In Example 133, the subject matter of Example 132 can optionally include wherein the third circuit is configured to update the first estimate of the codeword with the one or more Check-to-Variable messages for the first Check Node set to obtain a second estimate of the codeword before the pipeline decoding system finishes processing the second Check Node set by updating the posterior values of the one or more Variable Nodes with the one or more Check-to-Variable messages.

In Example 134, the subject matter of Example 131 can optionally include wherein the second estimate of the codeword corresponds to posterior values of the one or more Variable Nodes at a second time occurring after the first time.

In Example 135, the subject matter of Example 131 can optionally include wherein the first circuit is configured to process the first Check Node set by generating posterior values of estimated bits of the codeword for the one or more first Check Nodes.

In Example 136, the subject matter of Example 131 can optionally include wherein the first circuit is configured to process the second Check Node set after processing the first Check Node set by generating posterior values of estimated bits of the codeword for the one or more second Check Nodes.

In Example 137, the subject matter of any one of Examples 108 to 136 can optionally include wherein the third circuit is further configured to update the second estimate of the codeword with the one or more Check-to-Variable messages for the second Check Node set to obtain a third estimate of the codeword.

In Example 138, the subject matter of Example 137 can optionally include wherein the third circuit is configured to update the second estimate of the codeword with the one or more Check-to-Variable messages for the second Check Node set to obtain the third estimate of the codeword after updating the first estimate of the codeword.

In Example 139, the subject matter of any one of Examples 108 to 138 can optionally include wherein the second circuit is further configured to generate the one or more Check-to-Variable messages for the first Check Node set.

In Example 140, the subject matter of any one of Examples 108 to 139 can optionally include wherein the second circuit is configured to generate the one or more Check-to-Variable messages for the second Check Node set based on the first estimate of the codeword by applying the first estimate of the codeword to generate the one or more Check-to-Variable messages for the second Check Node set according to a belief propagation decoding algorithm, a minimum-sum decoding algorithm, or a sum-product decoding algorithm.

In Example 141, the subject matter of any one of Examples 108 to 140 can optionally include wherein the third circuit is configured to update the first estimate of the codeword with the one or more Check-to-Variable messages for the first Check Node set to obtain a second estimate of the codeword before the pipeline decoding system finishes processing the second Check Node set by updating the first estimate of the codeword with the one or more Check-to-Variable messages according to a belief propagation decoding algorithm, a minimum-sum decoding algorithm, or a sum-product decoding algorithm.

All acronyms defined in the above description additionally hold in all claims included herein.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A pipeline decoding system for performing pipelined decoding of a codeword characterized by one or more parity checks, the pipelined decoding system comprising:
   a first circuit configured to process a first parity set comprising one or more first parity checks of the codeword and to process a second parity set comprising one or more second parity checks of the codeword;
   a second circuit configured to generate one or more codeword update messages for the second parity set based on a first estimate of the codeword; and
   a third circuit configured to update the first estimate of the codeword with one or more codeword update messages for the first parity set to obtain a second estimate of the codeword, wherein the third circuit is configured to update the first estimate of the codeword with the one or more codeword update messages for the first parity set to obtain the second estimate of the codeword before the pipeline decoding system finishes processing the second parity set.

2. The pipeline decoding system of claim 1, wherein the first circuit is configured to process the second parity set after processing the first parity set, and wherein the second circuit and the third circuit are configured to operate simultaneously without stalls.

3. The pipeline decoding system of claim 1, wherein the pipeline decoding system comprises a plurality of circuits including the first circuit, the second circuit, and the third circuit, and wherein the pipeline decoding system further comprises a plurality of latch-based registers each configured to separate neighboring circuits of the plurality of circuits.

4. The pipeline decoding system of claim 3, wherein at least two of the plurality of circuits are configured to utilize one of the plurality of latch-based registers for pipeline time-borrowing to avoid timing violations between the at least two of the plurality of circuits due to tolerance of data arriving after a clock edge.

5. The pipeline decoding system of claim 1, wherein the codeword is a linear block codeword.

6. The pipeline decoding system of claim 1, wherein the one or more first parity checks and the one or more second parity checks correspond to one or more Check Nodes of the codeword and wherein the first estimate of the codeword corresponds to posterior values of one or more Variable Nodes of the codeword at a first time.

7. The pipeline decoding system of claim 6, wherein the second circuit is configured to generate the one or more codeword update messages for the second parity set based on the first estimate of the codeword by:
   generating one or more Check-to-Variable messages for the second parity set according to the posterior values of the one or more Variable Nodes at the first time.

8. The pipeline decoding system of claim 6, wherein the third circuit is configured to update the first estimate of the codeword with the one or more codeword update messages for the first parity set to obtain the second estimate of the codeword before the pipeline decoding system finishes processing the second parity set comprises:
   updating the posterior values of the one or more Variable Nodes with the one or more Check-to-Variable messages.

9. The pipeline decoding system of claim 6, wherein the second estimate of the codeword corresponds to posterior values of the one or more Variable Nodes at a second time occurring after the first time.

10. The pipeline decoding system of claim 1, wherein the third circuit is further configured to update the second estimate of the codeword with the one or more codeword update messages for the second parity set to obtain a third estimate of the codeword.

11. The pipeline decoding system of claim 1, wherein the second circuit is further configured to generate the one or more codeword update messages for the first parity set.

12. The pipeline decoding system of claim 1, wherein the second circuit is configured to generate the one or more codeword update messages for the second parity set based on the first estimate of the codeword by:
   applying the first estimate of the codeword to generate the one or more codeword update messages for the second parity set according to a belief propagation decoding algorithm, a minimum-sum decoding algorithm, or a sum-product decoding algorithm.

13. The pipeline decoding system of claim 1, wherein the third circuit is configured to update the first estimate of the codeword with the one or more codeword update messages for the first parity set to obtain a second estimate of the codeword before the pipeline decoding system finishes processing the second parity set by:
   updating the first estimate of the codeword with the one or more codeword update messages according to a belief propagation decoding algorithm, a minimum-sum decoding algorithm, or a sum-product decoding algorithm.

14. A method for performing decoding of a codeword with a pipelined decoding system comprising a plurality of pipeline decoding stages each configured to perform a respective pipeline decoding stage for one or more parity checks, the method comprising:
   initiating processing of a first parity set comprising one or more first parity checks of the codeword with the pipeline decoding system;
   initiating processing of a second parity set comprising one or more second parity checks of the codeword with the pipeline decoding system;
   generating one or more codeword update messages for the second parity set based on a first estimate of the codeword; and updating the first estimate of the codeword with one or more codeword update messages for the first parity set to obtain a second estimate of the codeword, wherein the updating the first estimate of the codeword with the one or more codeword update messages for the first parity set to obtain the second estimate of the codeword comprises updating the first estimate of the codeword with the one or more codeword update messages for the first parity set to obtain the second estimate of the codeword before the pipeline decoding system finishes processing the second parity set.

15. The method of claim 14, wherein the initiating processing of the second parity set comprises initiating processing of the second parity set after initiating processing of the first parity set with the pipeline decoding system, wherein the initiating processing of the first parity set comprises generating posterior values of estimated bits of the codeword for the one or more first parity checks and the initiating processing of the second parity set comprises generating posterior values of estimated bits of the codeword for the one or more second parity checks.

16. The method of claim 14, wherein the codeword is a linear block codeword.

17. The method of claim 14, wherein the one or more first parity checks and the one or more second parity checks correspond to one or more Check Nodes of the codeword and wherein the first estimate of the codeword corresponds to posterior values of one or more Variable Nodes of the codeword at a first time.

18. The method of claim 17, wherein the second estimate of the codeword corresponds to posterior values of the one or more Variable Nodes at a second time occurring after the first time.

19. A pipeline decoding system for performing pipelined decoding of a codeword characterized by one or more Check Nodes and one or more Variable Nodes, the pipelined decoding system comprising:
  a first circuit configured to process a first Check Node set comprising one or more first Check Nodes of the codeword and to process a second Check Node set comprising one or more second Check Nodes of the codeword Check Node;
  a second circuit configured to generate one or more Check-to-Variable messages for the second Check Node set based on a first estimate of the codeword; and
  a third circuit configured to update the first estimate of the codeword with one or more Check-to-Variable messages for the first Check Node set to obtain a second estimate of the codeword before the pipeline decoding system finishes processing the second Check Node set.

20. The pipeline decoding system of claim 19, wherein the first circuit is configured to process second Check Node set after processing the first Check Node set.

21. The pipeline decoding system of claim 19, wherein the first estimate of the codeword corresponds to posterior values of one or more Variable Nodes of the codeword at a first time.

22. The pipeline decoding system of claim 21, wherein the second estimate of the codeword corresponds to posterior values of the one or more Variable Nodes at a second time occurring after the first time.

23. The pipeline decoding system of claim 3, wherein the plurality of latch-based registers comprise master-slave latches configured to store results between at least two of the plurality of circuits.

24. The pipeline decoding system of claim 6, wherein when at least one of the first parity checks and at least one of the second parity checks are dependent on at least one same Variable Node, the pipeline decoding system is configured to process each of the plurality of parity checks without any pipeline stalls until convergence is detected or termination after a predetermined number of iterations, further comprises:
  the second circuit configured to generate one or more Check-to-Variable messages for the second parity set according to the posterior values of the one or more Variable Nodes at the first time; and
  the third circuit configured to update the posterior values of the one or more Variable Nodes with the one or more Check-to-Variable messages at a second time, wherein the second estimate of the codeword corresponds to posterior values of the one or more Variable Nodes at a second time occurring after the first time, wherein the first time and the second time occur in a same stage of the pipeline decoding system.

25. The pipeline decoding system of claim 24, wherein the third circuit comprises a master posterior memory latch and a slave posterior memory latch.

* * * * *